United States Patent
Kim et al.

(10) Patent No.: US 9,342,447 B2
(45) Date of Patent: May 17, 2016

(54) DATA STORAGE SYSTEM AND METHOD OF OPERATING DATA STORAGE SYSTEM

(71) Applicants: Kyung-Ryun Kim, Daejeon (KR); Sang-Yong Yoon, Daejeon (KR); Ki-Whan Song, Seoul (KR)

(72) Inventors: Kyung-Ryun Kim, Daejeon (KR); Sang-Yong Yoon, Daejeon (KR); Ki-Whan Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 280 days.

(21) Appl. No.: 13/957,901

(22) Filed: Aug. 2, 2013

(65) Prior Publication Data
US 2014/0047168 A1    Feb. 13, 2014

(30) Foreign Application Priority Data
Aug. 7, 2012    (KR) .................. 10-2012-0086317

(51) Int. Cl.
*G11C 16/00* (2006.01)
*G06F 12/02* (2006.01)
*G11C 11/56* (2006.01)
*G11C 16/34* (2006.01)

(52) U.S. Cl.
CPC ........ *G06F 12/0246* (2013.01); *G11C 11/5628* (2013.01); *G06F 2212/7203* (2013.01); *G11C 16/3418* (2013.01); *G11C 16/3427* (2013.01)

(58) Field of Classification Search
CPC ........... G11C 12/0246; G11C 11/5628; G11C 16/3427; G11C 16/3418
USPC ...................................................... 365/185.24
See application file for complete search history.

(56) References Cited

U.S. PATENT DOCUMENTS

| | | | |
|---|---|---|---|
| 7,450,417 B2 | 11/2008 | Kaneko et al. | |
| 7,660,159 B2 * | 2/2010 | Hwang | G11C 16/10 365/185.19 |
| 7,660,166 B2 * | 2/2010 | Lasser | G11C 11/5628 365/185.05 |
| 7,864,573 B2 | 1/2011 | Perlmutter et al. | |
| 8,559,226 B2 * | 10/2013 | Abe | G11C 11/5642 365/185.17 |
| 2005/0248992 A1 * | 11/2005 | Hwang | G11C 16/3454 365/185.28 |
| 2008/0181000 A1 * | 7/2008 | Lasser | G11C 11/5628 365/185.03 |
| 2009/0024905 A1 | 1/2009 | Shalvi et al. | |
| 2010/0318877 A1 | 12/2010 | Amato et al. | |
| 2010/0329034 A1 | 12/2010 | Bryant-Rich | |
| 2011/0113303 A1 | 5/2011 | Bedeschi et al. | |
| 2011/0305089 A1 * | 12/2011 | Abe | G11C 11/5642 365/185.17 |

* cited by examiner

*Primary Examiner* — Richard Elms
*Assistant Examiner* — Xiaochun L Chen
(74) *Attorney, Agent, or Firm* — Volentine & Whitt, PLLC

(57) ABSTRACT

A method of operating a data storage device includes providing a memory cell array that includes a first word line, a second word line and a buffer configured to store second data to be programmed into the second word line, reading the second data from the buffer, and programming first data into the first word line. A programming condition of the first data being is changed based on the second data read from the buffer.

28 Claims, 20 Drawing Sheets

Fig. 9

| WL | 1st | CRS | FIN |
|---|---|---|---|
| 63 | 188, 189 | 191 | |
| 62 | 185, 186 | 190 | |
| 61 | 182, 183 | 187 | |
| ⋮ | ⋮ | ⋮ | ⋮ |
| 3 | 8, 9 | 13 | |
| 2 | 5, 6 | 10 | |
| 1 | 2, 3 | 7 | |
| 0 | 0, 1 | 4 | |

*1st : 1$^{ST}$ Step (4-Level)
*CRS : Coarse PGM
*FIN : Fine PGM

DATA STORAGE SYSTEM AND METHOD OF OPERATING DATA STORAGE SYSTEM

A claim for priority under 35 U.S.C. §119 is made to Korean Patent Application No. 10-2012-0086317, filed on Aug. 7, 2012, in the Korean Intellectual Property Office, the entire contents of which are hereby incorporated by reference.

BACKGROUND

The inventive concept relates to a method of operating a data storage device, the data storage device, and a system using the data storage device.

Generally, a semiconductor memory device is a memory device that is implemented using a semiconductor material, such as silicon (Si), germanium (Ge), gallium arsenide (GaAs), or indium phosphide (InP). Semiconductor memory devices are broadly classified as volatile memory devices and nonvolatile memory devices.

Volatile memory devices lose stored data when the power supply is turned off. Examples of the volatile memory devices include static random access memories (SRAMs), dynamic random access memories (DRAMs), and synchronous dynamic random access memories (SDRAMs). In contrast, nonvolatile memory devices retain stored data even when the power supply is turned off or otherwise interrupted. Examples of the nonvolatile memory devices include flash memories, read-only memories (ROMs), programmable read-only memories (PROMs), erasable programmable read-only memories (EPROMs), electrically erasable programmable read-only memories (EEPROMs), and resistive memories (e.g., phase-change random access memories (PRAMs), ferroelectric random access memories (FRAMs), and resistive random access memories (RRAMs)).

In a flash memory, in particular, the threshold voltage of a memory cell corresponding to an upper portion of an erase state distribution tends to be shifted toward a program state distribution due to coupling with adjacent cells, a disturbance, or the like. The memory cell is therefore likely to have an error.

SUMMARY

Aspects of the inventive concept provide a method of operating a data storage device, the method being employed to effectively improve a bit error rate (BER). Aspects of the inventive concept also provide a data storage device and a data storage system that can effectively improve the BER. However, aspects of the inventive concept are not restricted to those set forth herein. The above and other aspects of the inventive concept will become more apparent to one of ordinary skill in the art to which the inventive concept pertains by referencing the detailed description of the inventive concept given below.

According to an aspect of the inventive concept, there is provided a method of operating a data storage device. The method includes providing a memory cell array that includes a first word line, a second word line and a buffer configured to store second data to be programmed into the second word line, reading the second data from the buffer, and programming first data into the first word line. A programming condition of the first data being is changed based on the second data read from the buffer.

According to another aspect of the inventive concept, there is provided a method of operating a data storage device. The method includes sensing whether multiple memory cells belong to a first partial distribution or a second partial distribution included in a first threshold voltage distribution, where the first partial distribution and the second partial distribution do not overlap each other. The method further includes shifting A % of memory cells, included in the first partial distribution, to correspond to a second threshold voltage distribution which is different from the first threshold voltage distribution, and shifting B % of memory cells, included in the second partial distribution, to correspond to the second threshold voltage distribution, where 0<A≤100, 0<B≤100, and B<A.

According to still another aspect of the inventive concept, there is provided a method of operating a data storage device. The method include sensing whether multiple memory cells belong to a first partial distribution or a second partial distribution, where the first partial distribution and the second partial distribution are included in a first threshold voltage distribution and do not overlap each other. The method further includes selecting memory cells having high error rates from memory cells corresponding to the second partial distribution, and shifting the selected memory cells having the high error rates to correspond to a second threshold voltage distribution which is different from the first threshold voltage distribution.

According to still another aspect of the inventive concept, there is provided a data storage system including a nonvolatile memory device, a buffer and a controller. The nonvolatile memory device includes a memory cell array comprising a plurality of memory cells connected to a plurality of word lines and a plurality of bit lines. The buffer is configured to store temporarily data sent from a host and data read out from the nonvolatile memory device. The controller is configured to interface with the host and the nonvolatile memory device, and to control storing the data sent from the host into the nonvolatile memory device, the data including at least first data and second data. Before the first data is programmed into a first word line of the plurality of word lines, second data to be programmed into a second word line of the plurality of word lines is read from the buffer and a programming condition of the first data is changed based on the second data.

BRIEF DESCRIPTION OF THE DRAWINGS

Exemplary embodiments of the inventive concept will be more clearly understood from the following detailed description taken in conjunction with the accompanying drawings, in which:

FIGS. 9 and 10 are diagrams illustrating, in more detail, the data storage device operation method of FIG. 7.

DETAILED DESCRIPTION OF THE EMBODIMENTS

Figure 1:
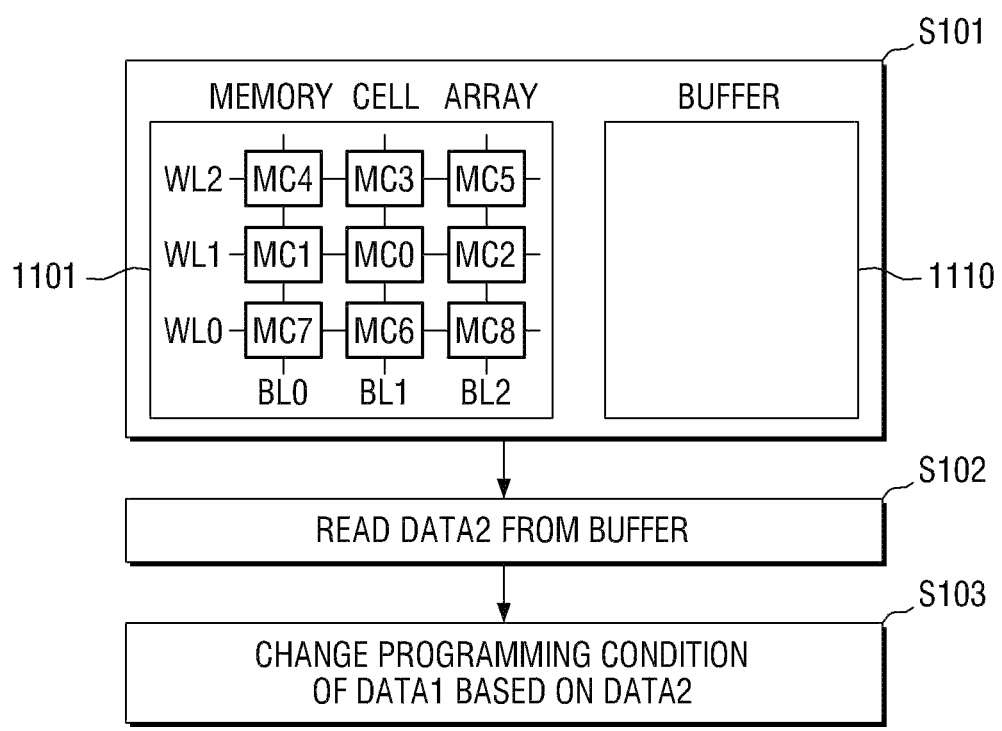
FIG. 1 is a flowchart illustrating a method of operating a data storage device, according to embodiments of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the concept of the inventive concept to one of ordinary skill in the art. Thus, in some embodiments, well-known methods, procedures, components, and circuitry have not been described in detail to avoid unnecessarily obscuring aspects of the present invention. In the drawings, like reference numerals denote like elements.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of operating a data storage device, according to embodiments of the inventive concept. FIGS. 2A through 2D are block diagrams illustrating aggressor cells and a victim cell.

Referring to FIG. 1, a memory cell array 1101 and a buffer 1110 are provided (operation S101). The memory cell array 1101 includes a plurality of word lines WL0 through WL2, a plurality of bit lines BL0 through BL2, and a plurality of memory cells MC0 through MC8. The memory cells MC0 through MC8 are respectively formed at intersections of the word lines WL0 through WL2 and the bit lines BL0 through BL2. However, the inventive concept is not limited thereto. More particularly, FIG. 1 shows the first (lower) word line WL0, second word line WL1 and third (upper) word line WL2, shows the first bit line BL0, second bit line BL1 and third bit line BL2, and shows three memory cells of the memory cells MC0 through MC8 connected to each of the first through third word lines WL0 to WL2. However, the inventive concept is not limited thereto.

A program operation may be performed in order from the first word line WL0 to the third word line WL2. That is, after first data DATA1 is programmed into the memory cells MC7, MC6 and MC8 connected to the first word line WL0, second data DATA2 is programmed into the memory cells MC1, MC0 and MC2 connected to the second word line WL1. Then, third data DATA3 is programmed into the memory cells MC4, MC3, and MC5 connected to the third word line WL2.

The buffer 1110 is a region in which data to be programmed into the memory cell array 1101 is stored in advance. That is, the buffer 1110 may store the first data DATA1, the second data DATA2 and the third data DATA3 which are to be programmed into the memory cells MC0 through MC8 connected to the first through third word lines WL0 through WL2. As will be described below, the buffer 1110 may be located in a nonvolatile memory device 1100 or in a controller 1200. When the buffer 1110 is located in the nonvolatile memory device 1100, it may consist of flash memory cells. When the buffer 1110 is located in the controller 1200, it may consist of static random access memory (SRAM) cells. However, the inventive concept is not limited thereto.

Before the first data DATA1 is programmed into the first word line WL0, the second data DATA2 is read from the buffer 1110 (operation S102). The second data DATA2 is data not yet programmed into the memory cell array 1101. The first data DATA1 is programmed into the first word line WL0, where a programming condition of the first data DATA1 is changed based on the second data DATA2 (operation S103).

Similarly, when the second data DATA2 is programmed into the second word line WL1, the third data DATA3 is first read from the buffer 1110, and a programming condition of the second data DATA2 is changed based on the third data DATA3. Here, the third data DATA3 is data not yet programmed into the memory cell array 1101.

The above process is used because each memory cell is affected by surrounding cells. That is, a memory cell may have an error due to coupling with adjacent cells, a program/pass/read disturb, etc.

Figure 2A:
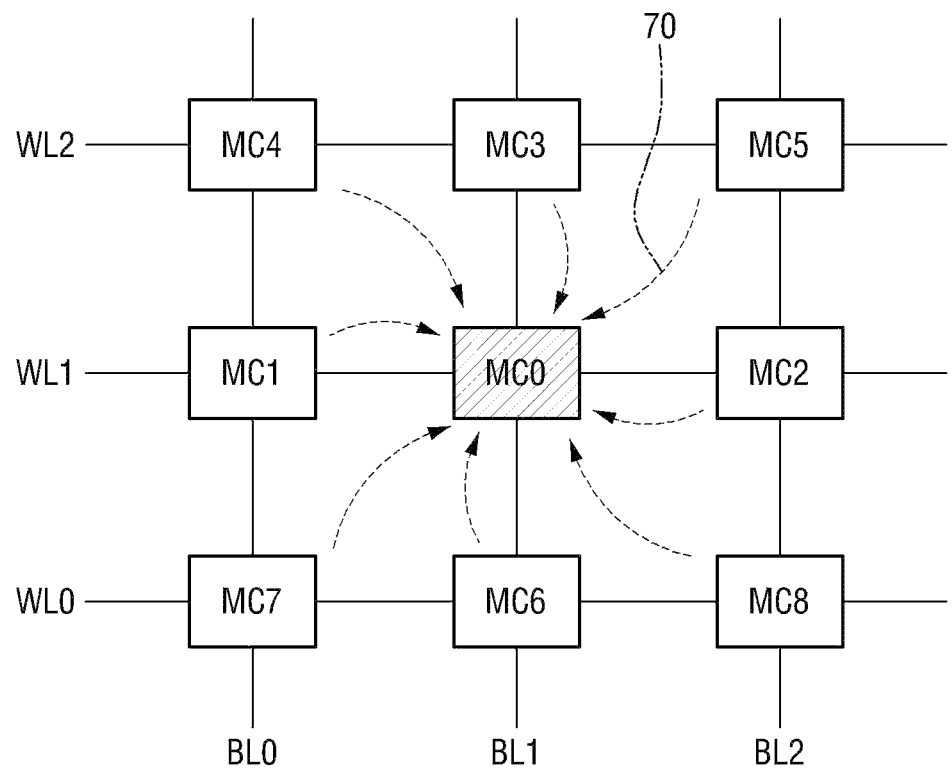
FIGS. 2A through 2D are block diagrams illustrating aggressor cells and a victim cell.

For example, referring to FIG. 2A, a threshold voltage of the memory cell MC0 may be shifted by effect 70 of the surrounding memory cells MC1 through MC8. The surrounding memory cells MC1 through MC8 which affect the memory cell MC0 may be called "aggressor cells," and the memory cell MC0 affected by the surrounding memory cells MC1 through MC8 may be called a "victim cell." For example, when a high program voltage is applied to an aggressor cell to program the aggressor cell, the victim cell may be affected. That is, there is a relatively high likelihood that the victim cell will have an error, referred to as a "high error rate." Therefore, whether the memory cell MC0 has a high error rate may be determined based on data that is to be programmed into the surrounding memory cells MC1 through MC8.

For example, it is assumed that the memory cells MC0 through MC8 are 4-bit multi-level cells (MLCs). That is, 0000 through 1110 may be programmed into the memory cells MC0 through MC8. In this case, when 1110, 1101 and 1100, for example, are programmed into a preset number of surrounding memory cells MC1 through MC8 from among a total number of surrounding memory cell MC0, it can be determined that the memory cell MC0 has a high error rate (that is, a high likelihood of having an error).

In the method of operating a semiconductor storage device according to the embodiments of the inventive concept, when the memory cell MC0 has a high error rate, a programming condition of the memory cell MC0 may be changed.

Figure 2B:
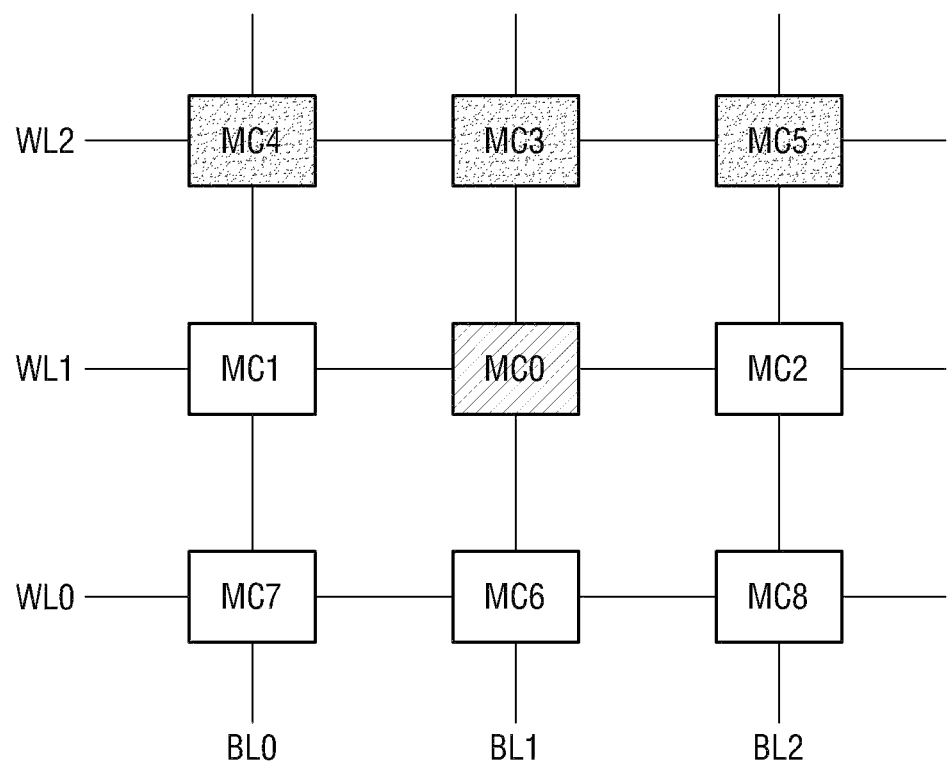

For example, referring to FIG. 2B, the memory cell MC0 may be affected by at least one of the memory cells MC4, MC3 and MC5 connected to third word line WL2. The memory cell MC0 may be greatly affected by a program voltage applied during a program operation. The program operation may be performed in the order of the memory cells MC7, MC6 and MC8 connected to the first word line WL0, the memory cells MC1, MC0 and MC2 connected to the second word line WL1, and the memory cells MC4, MC3 and MC5 connected to the third word line WL2. In this case, referring to FIG. 2B, the memory cell MC0 may be affected by data that is programmed, in particular, into the memory cells MC4, MC3 and MC5 connected to the third word line WL2. That is, when data corresponding to a high threshold voltage is programmed into the memory cells MC4, MC3 and MC5, a high program voltage is applied to the memory cells MC4, MC3 and MC5. In this case, the high program voltage may affect the memory cell MC0, thereby increasing a threshold voltage of the memory cell MC0.

Figure 2C:
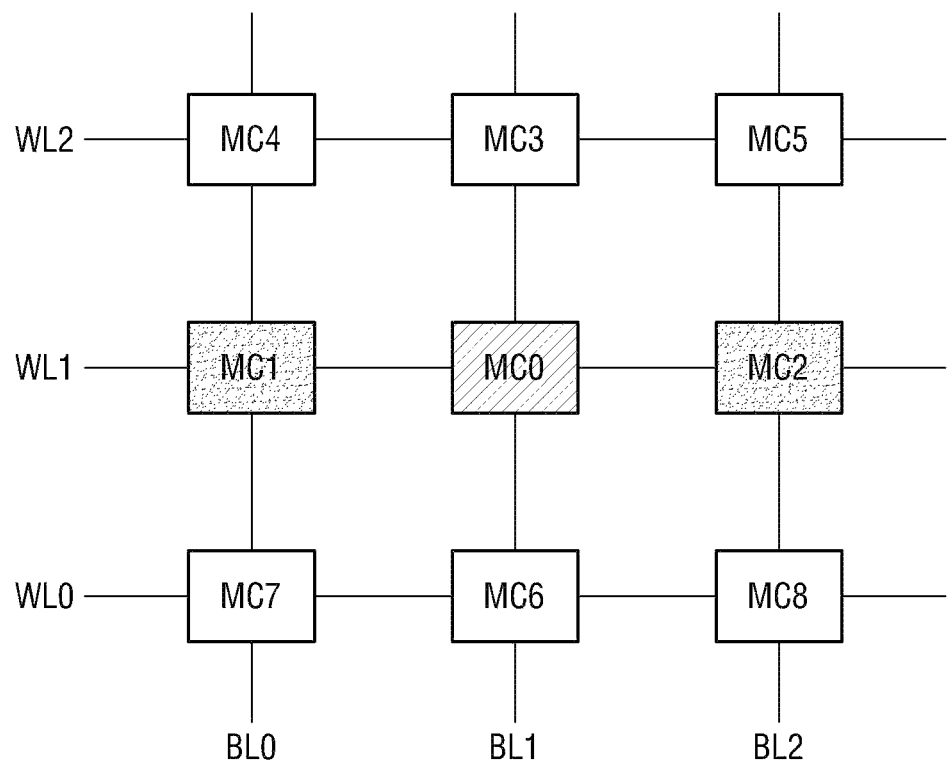

In another example, referring to FIG. 2C, the memory cell MC0 may also be affected by the memory cells MC1 and MC2 connected to the same word line (second word line WL1) as the memory cell MC0. That is, the memory cell MC0 may be affected by data that is programmed into the memory cells MC1 and MC2 connected to the second word line WL1. In other words, when data corresponding to a high threshold voltage is programmed into the memory cells MC1 and MC2, a high program voltage is applied to the memory cells MC1 and MC2. In this case, the high program voltage may affect the memory cell MC0, thereby increasing the threshold voltage of the memory cell MC0.

Figure 2D:
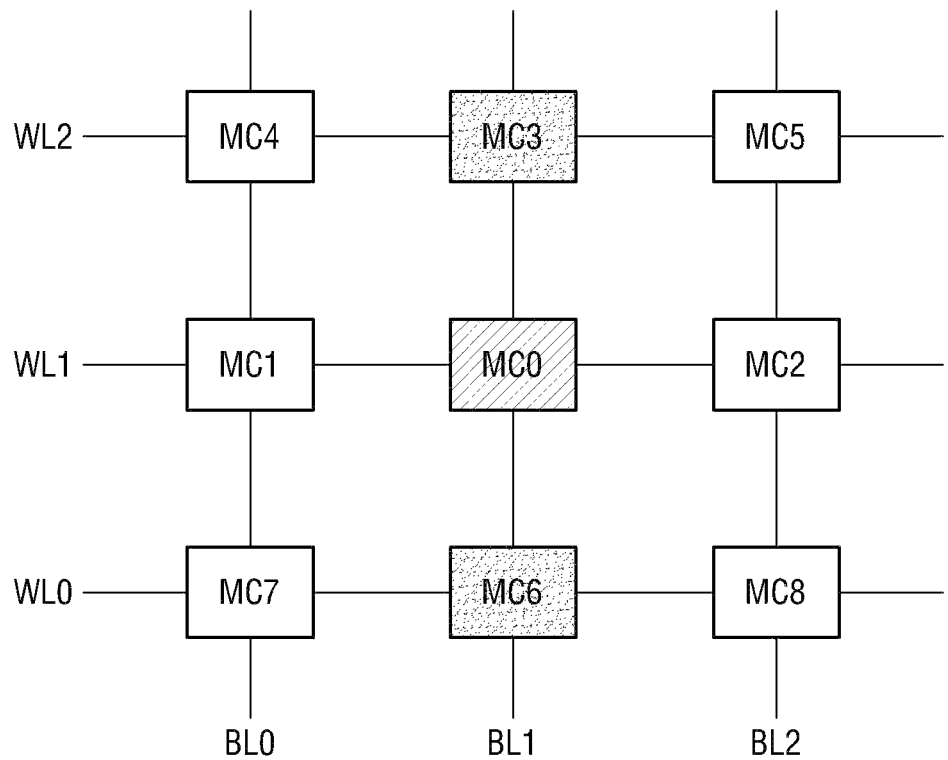

In another example, referring to FIG. 2D, the memory cell MC0 may also be affected by the memory cells MC3 and MC6 connected to the same bit line (second bit line BL1) as the memory cell MC0. That is, the memory cell MC0 may be affected by data that is programmed into the memory cells MC3 and MC6 connected to the second bit line BL1. In other words, when data corresponding to a high threshold voltage is programmed into the memory cells MC3 and MC6, a high program voltage is applied to the memory cells MC3 and MC6. In this case, the high program voltage may affect the memory cell MC0, thereby increasing the threshold voltage of the memory cell MC0.

Although not illustrated in a separate drawing, an error rate can be estimated based on data that is to be programmed into the surrounding memory cells MC4, MC3, MC5, MC1 and MC2 by combining the contents of FIGS. 2B and 2C, by combining the contents of FIGS. 2B and 2D, by combining the contents of FIGS. 2C and 2D, or by combining the contents of FIGS. 2B, 2C and 2D.

The programming condition can be changed in various ways. For example, a program voltage used to program data may be changed. In this case, the magnitude of the program voltage may be changed, or the time during which the program voltage is applied may be changed.

Alternatively, when data is programmed using incremental step pulse programming (ISPP), for example, the program voltage is an ISPP voltage that is increased step by step from a start voltage by a delta voltage in each program loop. In this case, changing the programming condition may include changing the start voltage and/or the delta voltage, for example, as described below with reference to FIG. 5.

Alternatively, after the program voltage is applied during a program operation, a verify operation may be performed to verify whether data has been programmed properly. In this case, changing the programming condition may include changing the verify voltage, as described below with reference to FIG. 6.

Alternatively, a program operation may be performed through multiple steps. For example, in 3-step programming, the program operation may be performed in the order of a 1-step program, a coarse program, and a fine program. In this case, changing the programming condition may include changing the condition for at least one of the 1-step program, the coarse program, and the fine program, as described below with reference to FIGS. 7 through 10.

Alternatively, when a memory cell having a high error rate (that is, a memory cell highly likely to have an error) is selected, the selected memory cell may be shifted to a threshold voltage distribution having a low error rate. For example, a memory cell corresponding to an uppermost portion of an erase state distribution may automatically be shifted to a lowest program state distribution, and a memory cell corresponding to a second uppermost portion of the erase state distribution may be shifted to the lowest program state distribution only when the memory cell has a high error rate, as described below with reference to FIGS. 11 through 16.

Figure 3:
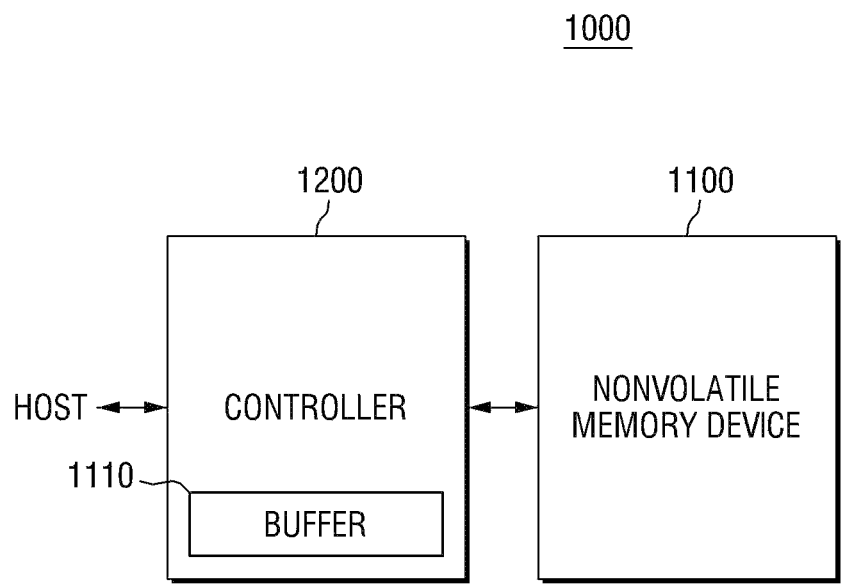
FIGS. 3 and 4 are block diagrams of data storage systems, according to embodiments of the inventive concept.
Figure 4:
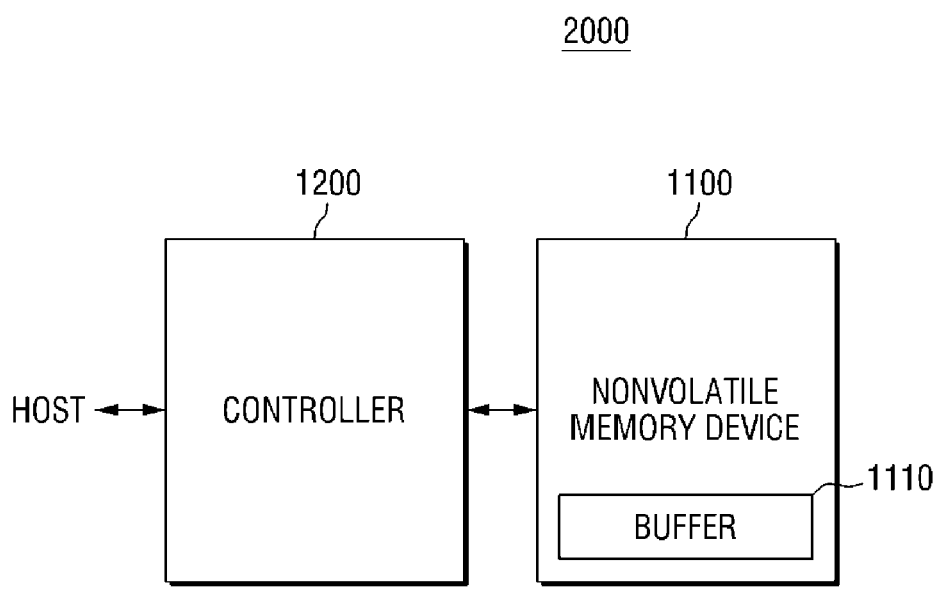

FIGS. 3 and 4 are block diagrams of data storage systems, according to embodiments of the inventive concept.

Referring to FIGS. 3 and 4, the data storage systems 1000 and 2000 each include a nonvolatile memory device (data storage device) 1100, a buffer 1110, and a controller 1200.

The controller 1200 is connected to a host and the nonvolatile memory device 1100. The controller 1200 is configured to access the nonvolatile memory device 1100 in response to a request from the host. For example, the controller 1200 may be configured to control read, write, erase and background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 further includes well-known components, such as a random access memory (RAM), a processing unit, a host interface, and a memory interface. The RAM is used as at least one of an operation memory of the processing unit, a cache memory between the nonvolatile memory device 1100 and the host, and a buffer memory between the nonvolatile memory device 1100 and the host. The processing unit controls the overall operation of the controller 1200.

The host interface includes protocols used to perform data exchanges between the host and the controller 1200. For example, the controller 1200 may communicate with an external device (host) using at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, for example. The memory interface interfaces with the nonvolatile memory device 1100. The memory interface may includes a NAND interface or a NOR interface, for example.

The data storage systems 1000 and 2000 may additionally include an error correction block (not shown). The error correction block is configured to detect and correct errors of data read from the nonvolatile memory device 1100 by using error correction code (ECC). The error correction block may be provided as a component of the controller 1200. Alternatively, the error correction block may be provided as a component of the nonvolatile memory device 1100.

The controller 1200 and the nonvolatile memory device 1100 may be integrated into one semiconductor device. Specifically, the controller 1200 and the nonvolatile memory device 1100 may be integrated into one semiconductor device to form a memory card. For example, the controller 1200 and the nonvolatile memory device 1100 may be integrated into one semiconductor device to form a personal computer (PC) card (e.g., Personal Computer Memory Card International Association (PCMCIA)), a compact flash card (CF), a smart media card (SM, SMC), a memory stick, a multimedia card (e.g., MMC, RS-MMC, MMCmicro), a SD card (e.g., SD, miniSD, microSD, SDHC), or a universal flash storage (UFS), for example.

Alternatively, the controller 1200 and the nonvolatile memory device 1100 may be integrated into one semiconductor device to form a solid state drive (SSD). The SSD includes a storage device which stores data in a semiconductor memory. When the data storage system 1000 or 2000 is an SSD, the operation speed of the host connected to the data storage system 1000 or 2000 may increase significantly.

The data storage systems 1000 and 2000 may be implemented in a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

The nonvolatile memory device 1100 or the data storage systems 1000 and 2000 may be packaged using various types of packages. For example, the nonvolatile memory device 1100 or the data storage systems 1000 and 2000 may be packaged using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

Referring to FIG. 3, the buffer 1110 is located within the controller 1200 of the data storage system 1000. The buffer 1110 may store data to be programmed. When the buffer 1110 is located within the controller 1200, it may consist of SRAM cells, for example. However, the inventive concept is not limited thereto.

Referring to FIG. 4, the buffer 1110 is located within the nonvolatile memory device 1100 of the data storage system 2000. When the buffer 1110 is located within the nonvolatile memory device 1100, it may consist of flash memory cells, for example. The method of operating a data storage device according to the embodiments of the inventive concept may be applied to a data storage system which employs an on-chip buffered program. In the on-chip buffered program, data to be programmed is stored in a buffer of a memory device and then programmed into a memory cell array. Therefore, it is easy to know what data is to be programmed into memory cells connected to an upper word line.

The buffer 1110 may be in the form of a single-level memory cell (SMC) block, although it is not limited to the SMC block. When the buffer 1110 is included in the nonvolatile memory device 1100, the controller 1200 does not need to have a buffer (e.g., an SRAM buffer). That is, the controller 1200 without a buffer and the nonvolatile memory device 1100 with the buffer 1110 can interwork with each other.

Figure 5:
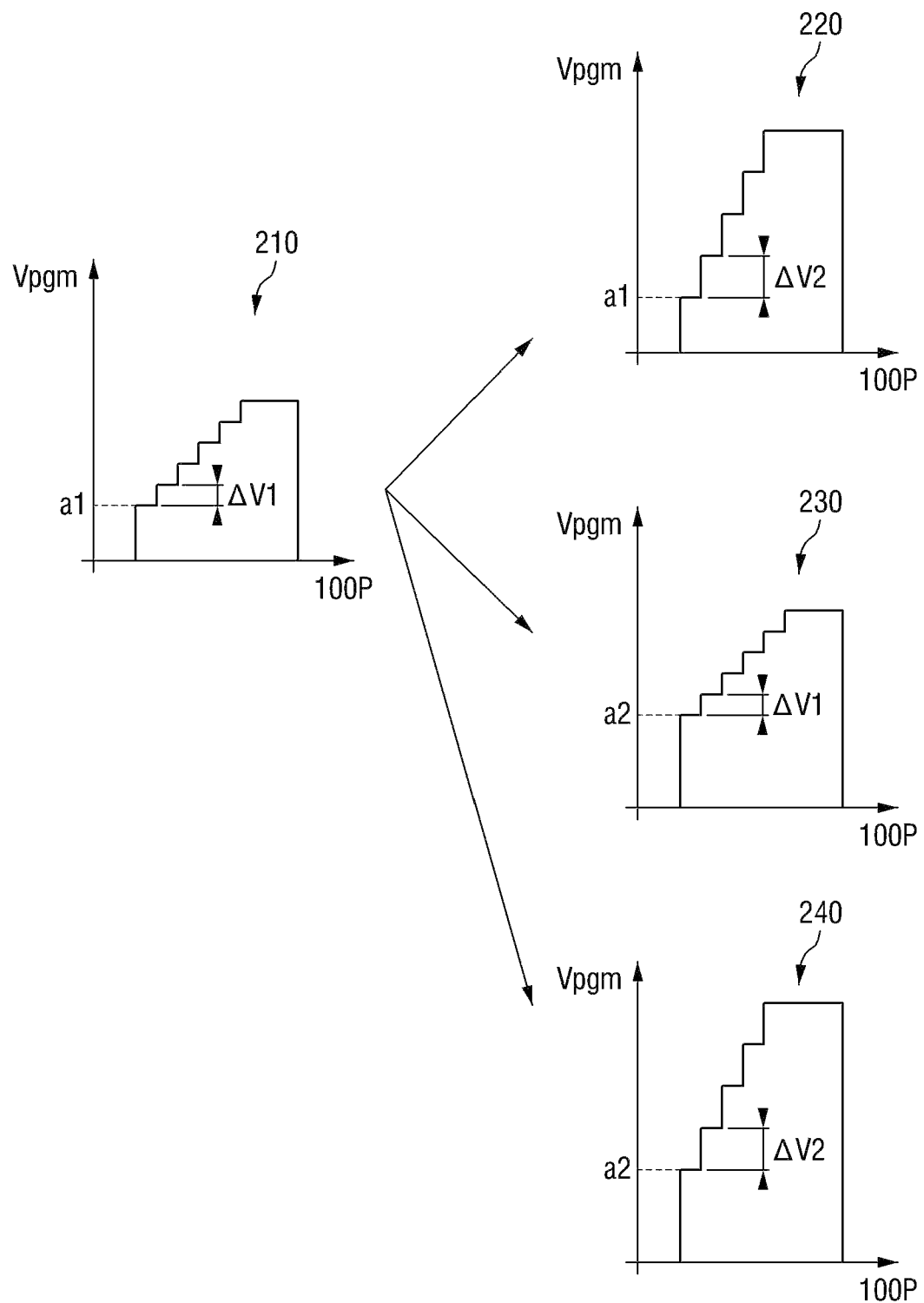
FIG. 5 is a diagram illustrating a method of operating a data storage device, according to a first embodiment of the inventive concept.

FIG. 5 is a diagram illustrating a method of operating a data storage device, according to a first embodiment of the inventive concept.

Referring to FIG. 5, a program voltage used to program data in a memory cell may be changed. Here, the program voltage may be increased or reduced according to data that is to be programmed into memory cells surrounding the memory cell. For example, the size of the program voltage or the time during which the program voltage is applied may be changed.

FIG. 5, in particular, is directed to a program voltage that is an ISPP voltage for programming data using an ISPP method. In this case, ISPP voltage 210 is increased step by step from a start voltage a1 to a target voltage b by a delta voltage $\Delta V1$ in each program loop.

A programming condition may be changed based on data that is to be programmed into surrounding memory cells by changing various parameters. For example, the delta voltage $\Delta V1$ of the ISPP voltage 210 may be changed to produce an ISPP voltage 220. That is, the delta voltage $\Delta V1$ is increased to delta voltage $\Delta V2$ according to the data that is to be programmed into the surrounding memory cells. Likewise, the delta voltage $\Delta V1$ may be decreased to a different delta voltage $\Delta V2$ (not shown) according to the data that is to be programmed into the surrounding memory cells.

Alternatively, the start voltage a1 of the ISPP voltage 210 may be changed to produce an ISPP voltage 230. That is, the start voltage a1 is increased to a start voltage a2 according to the data that is to be programmed into the surrounding memory cells. Likewise, the start voltage a1 may be decreased to a different start voltage a2 (not shown) according to the data that is to be programmed into the surrounding memory cells Alternatively, both the start voltage a1 and the delta voltage $\Delta V1$ of the ISPP voltage 210 may be changed to produce an ISPP voltage 240. That is, according to the data that is to be programmed into the surrounding memory cells, the start voltage a1 may be increased (or reduced) to the start voltage a2, and the delta voltage ΔV1 may be increased (or reduced) to the delta voltage ΔV2. In FIG. 5, a case where both the start voltage a1 and the delta voltage ΔV1 are increased is illustrated as an example.

Figure 6:
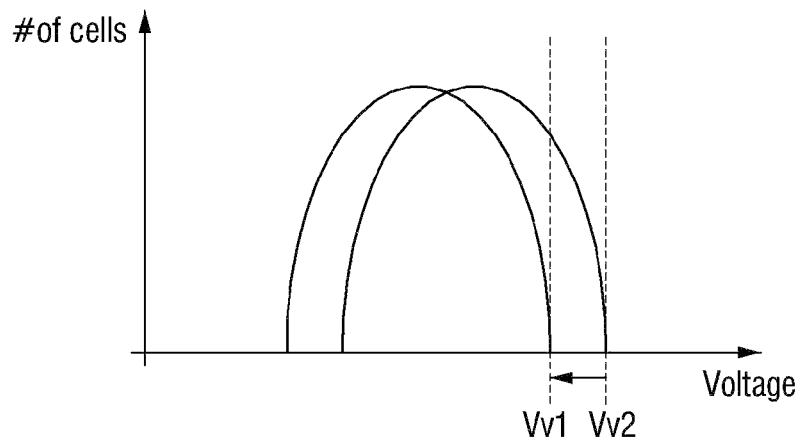
FIG. 6 is a diagram illustrating a method of operating a data storage device, according to a second embodiment of the inventive concept.

FIG. 6 is a diagram illustrating a method of operating a data storage device, according to a second embodiment of the inventive concept.

Referring to FIG. 6, after a program voltage is applied to a memory cell, a verify operation is performed to verify whether data has been programmed properly. Here, a verify voltage may be increased or reduced according to data that is to be programmed into memory cells surrounding the memory cell. In FIG. 6, a case in which a verify voltage Vv2 is reduced to a verify voltage Vv1 is illustrated as an example.

Figure 7:
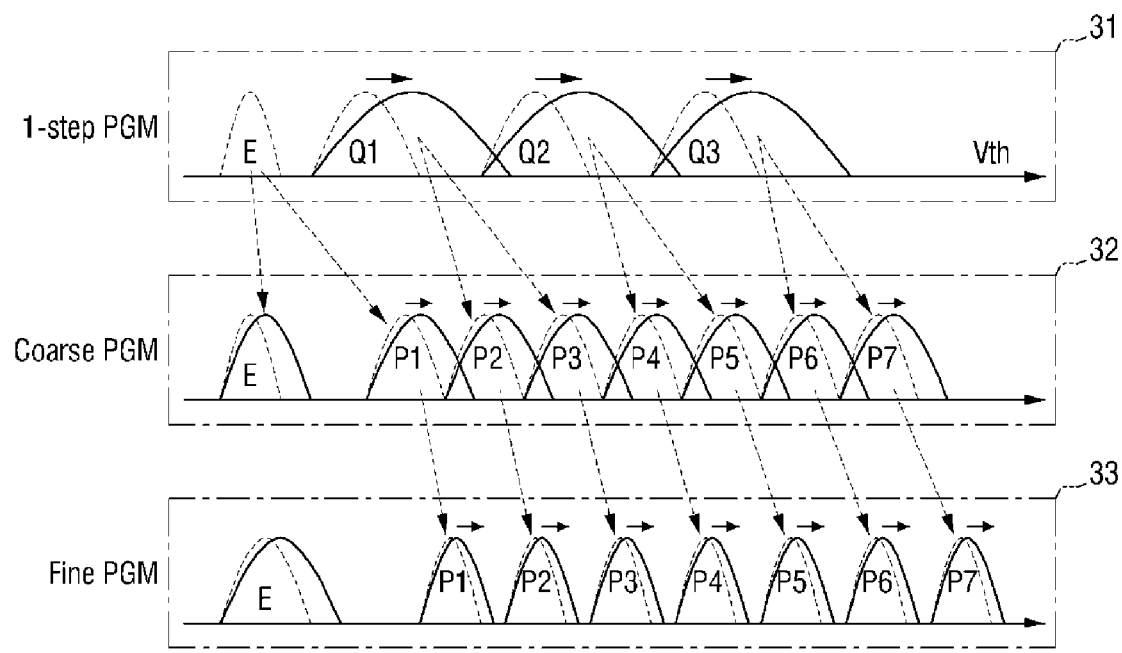
FIG. 7 is a diagram illustrating a method of operating a data storage device, according to a third embodiment of the inventive concept.

FIG. 7 is a diagram illustrating a method of operating a data storage device, according to a third embodiment of the inventive concept. Specifically, FIG. 7 is a diagram illustrating variations in threshold voltage distributions when 3-bit data is programmed into each memory cell according to a 3-step programming operation. In addition, an address scramble operation may be performed during the 3-step programming program operation.

Referring to FIG. 7, 2-page data (i.e., first and second pages of data) are stored in memory cells connected to a selected word line (e.g., first word line WL0 in FIG. 1). At this time, as shown in box 31 of FIG. 7, memory cells corresponding to an erase state distribution E (i.e., a threshold voltage distribution corresponding to an erase operation) are programmed to correspond to a program state distribution Q1, Q2 or Q3 (i.e., a threshold voltage distribution corresponding to a program operation) according to data to be programmed.

Then, a 1-step program operation is performed on memory cells connected to an adjacent word line (e.g., second word line WL1 in FIG. 1). As a result, as indicated by solid lines in the box 31 of FIG. 7, distributions of the 1-step programmed memory cells connected to the selected word line WL0 may widen due to coupling caused when the memory cells connected to the adjacent word line WL1 are programmed.

Next, a coarse program operation is performed on the memory cells connected to the selected word line WL0. As shown in box 32 of FIG. 7, memory cells corresponding to the erase state distribution E are programmed to correspond to a program state distribution P1 according to data to be programmed. Memory cells corresponding to the program state distribution Q1 are programmed to correspond to program state distributions P2 and P3 according to data to be programmed. Memory cells corresponding to the program state distribution Q2 are programmed to correspond to program state distributions P4 and P5 according to data to be programmed. Memory cells corresponding to the program state distribution Q3 are programmed to correspond to program state distributions P6 and P7 according to data to be programmed.

Next, a 1-step program operation and a coarse program operation may be performed on memory cells connected to adjacent word lines (e.g., second and third word lines WL1 and WL2 in FIG. 1). As a result, as indicated by solid lines in the box 32 of FIG. 7, distributions of the coarse-programmed memory cells connected to the selected word line WL0 may widen due to coupling caused when the memory cells connected to the adjacent word lines WL1 and WL2 are programmed. For this reason, it is difficult to accurately read data from the coarse-programmed memory cells.

Next, a fine program operation is performed on the memory cells connected to the selected word line WL0. The memory cells connected to the selected word line WL0 are programmed to have final threshold voltage distributions P1 through P7 as shown in box 33 of FIG. 7. As described above, the fine program operation requires previously programmed data (e.g., first through third pages of data). Since it is difficult to accurately read the previously programmed data from the memory cells connected to the selected word line WL0, the fine program operation may be performed based on data provided by a controller (or data held in a memory device). As indicated by solid lines in the box 33 of FIG. 7, distributions of the fine-programmed memory cells may widen due to coupling caused when the memory cells connected to the adjacent word lines WL1 and WL2 are programmed.

Then, a 1-step program operation, a coarse program operation, and a fine program operation may be performed on each word line in a similar manner.

Figure 8:
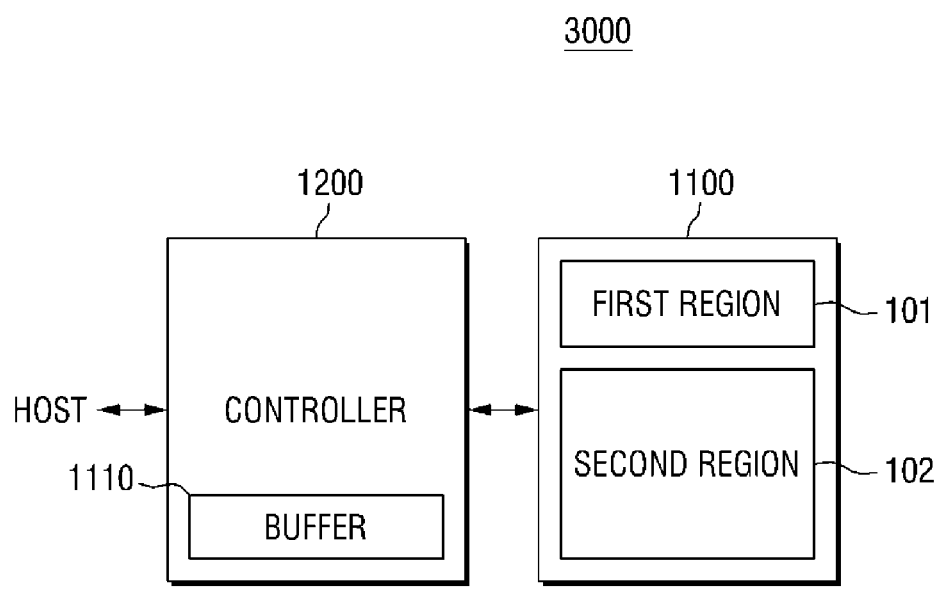
FIG. 8 is a block diagram of a data storage system used in the data storage device operation method of FIG. 7, according to a third embodiment of the inventive concept.

FIG. 8 is a block diagram of a data storage system used in the data storage device operation method of FIG. 7, according to the third embodiment.

Referring to FIG. 8, a data storage system 3000 includes a nonvolatile memory device 1100, a controller 1200, and a host. The nonvolatile memory device 1100 includes a plurality of memory blocks (or sectors/banks), and each memory block includes a plurality of memory cells arranged in a plurality of rows and a plurality of columns. In addition, each memory cell may store multi-bit (or multi-level) data. The nonvolatile memory device 1100 may have a 2D array structure or a 3D array structure (or a vertical array structure).

The memory blocks of the nonvolatile memory device 1100 are divided into a first region 101 and a second region 102. The first and second regions 101 and 102 may be defined logically, not physically. The definition of the first and second regions 101 and 102 can be changed logically. Memory blocks included in the first region 101 may be programmed in a different way from memory blocks included in the second region 102.

For example, the memory blocks included in the first region 101 may be programmed according to a single-bit program (hereinafter, referred to as an SLC program), and the memory blocks included in the second region 102 may be programmed according to a multi-bit program (e.g., the above-described N-step reprogram) (hereinafter, referred to as an MLC program). In other words, each memory cell in the first region 101 may store 1-bit data, while each memory cell in the second region 102 may store M-bit data (M being an integer of 3 or more). Further, each memory cell in the first region 101 may store fewer data bits in number as compared with the M-bit data stored in each memory cell in the second region 102.

The controller 1200 is configured to control the nonvolatile memory device 1100 in response to a request of the host. The controller 1200 includes a buffer 1110. The buffer 1110 temporarily stores data sent from the host and data read out from the nonvolatile memory device 1100. The controller 1200 may control a program operation of the nonvolatile memory device 1100 in a static scheduling manner. For example, when data of the minimum program unit of the first region 101 is stored in the buffer 1110, the controller 1200 may control the nonvolatile memory device 1100 such that data of the minimum program unit is stored in the first region 101. This is referred to as a buffer program operation. When data of the minimum program unit of the second region 102 is gathered at the first region 101, the controller 1200 controls the nonvolatile memory device 1100 such that data of the minimum program unit of the second region 102 is stored in the second region 102. This is referred to as a main program operation.

The minimum program unit of the first region 101 and the minimum program unit of the second region 102 may be variously determined depending upon a program method, the number of bits per cell, and the like. The minimum program unit of the first region 101 may be different from the minimum program unit of the second region 102. It is possible to minimize the size of the buffer 1110 of the controller 1200 by storing data in the first region 101 through the buffer program operation and storing data in the second region 102 through the main program operation.

Figure 10:
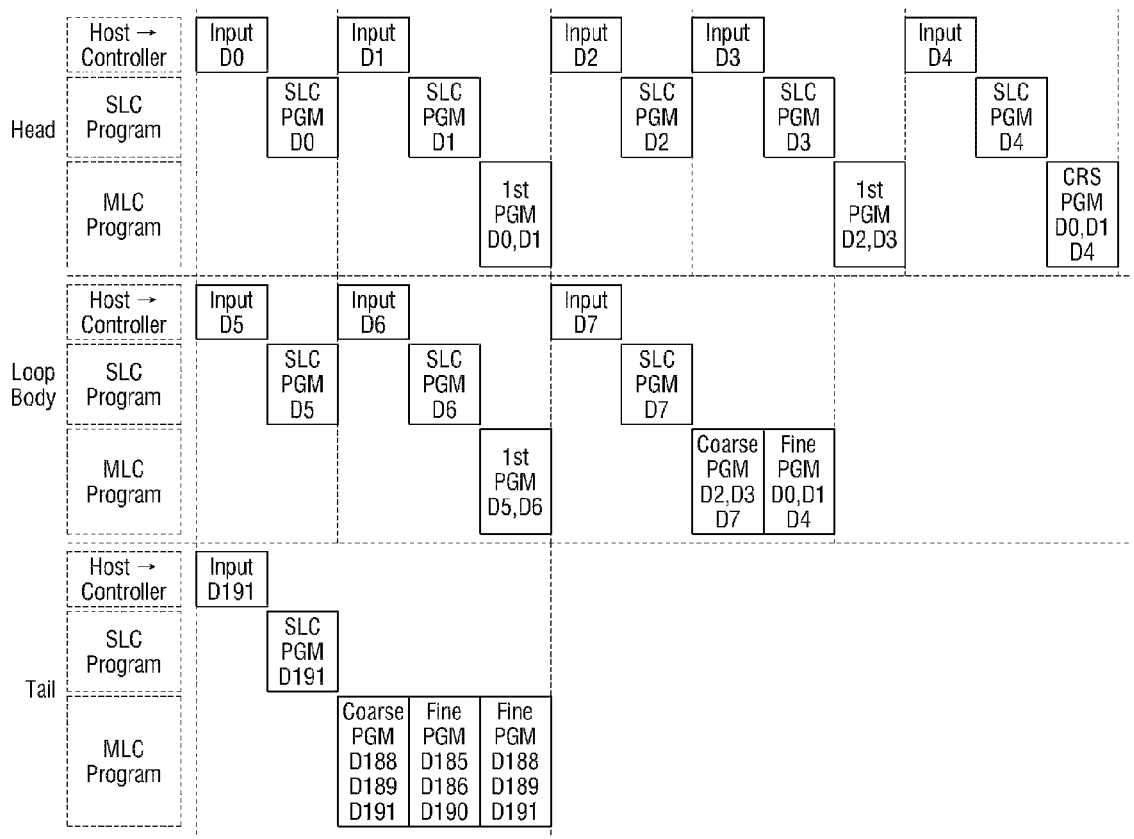

FIGS. 9 and 10 are diagrams illustrating, in more detail, the data storage device operation method of FIG. 7, according to embodiments of the inventive concept. FIGS. 9 and 10 are diagrams illustrating an exemplary address scramble technique of a nonvolatile memory device which stores 3-bit data in each memory cell and to which a 3-step reprogram method is applied.

In order to simplify description, as illustrated in FIG. 9, it is assumed that each memory block includes 64 word lines WL0 to WL63 and that each memory cell stores 3-bit data. With this assumption, 192 pages may be stored in each memory block.

Referring to FIGS. 9 and 10, when data Di (i=0 to 191) of the minimum program unit of the first region 101 is stored in the buffer 1110 of the controller 1200, the data Di stored in the buffer 1110 is programmed in the first region 101 of the nonvolatile memory device 1100 through an SLC program operation. The controller 1200 determines whether data of the minimum program unit of the second region 102 is gathered at the first region 101 and executes a 1-step program operation, a coarse program operation, or a fine program operation on the second region 102 according to the determination result. The 1-step program operation, the coarse program operation or the fine program operation on the second region 102 may be determined according to an address scramble order, an example of which is shown in FIG. 9. For example, if data D0 and D1 are stored in the first region 101, the 1-step program operation may be performed on a word line WL0 based on the data D0 and D1 stored in the first region 101. If data D2 and D3 are stored in the first region 101, the 1-step program operation may be performed on a word line WL1. That is, the 1-step program operation may be performed on the word line WL1 based on the data D2 and D3 stored in the first region 101.

If data D4 is stored in the first region 101, the coarse program operation may be performed on the word line WL0 based on the data D0, D1 and D4 stored in the first region 101.

If data D5 and D6 are stored in the first region 101, the 1-step program operation may be performed on a word line WL2 based on the data D5 and D6 stored in the first region 101. If data D7 is stored in the first region 101, the coarse program operation may be performed on the word line WL1 based on the data D2, D3 and D7 stored in the first region 101. After the coarse program operation is performed on the word line WL1 based on the data D2, D3 and D7 stored in the first region 101, the fine program operation may be performed on the word line WL0 based on the data D0, D1 and D4 stored in the first region 101.

Subsequently, until data 191 is stored in the first region 101, the remaining data D8 through D190 are stored in the second region 102 in the same order as the 1-step program operation of the data D5 and D6, the coarse program operation of the data D7, and the fine program operation of the data D0, D1 and D4.

If the data D191 is stored in the first region 101, the coarse program operation may be performed on a word line WL63 based on the data D188, D189 and D191 stored in the first region 101. After the coarse program operation is performed on the word line WL63 based on the data D188, D189 and D191 stored in the first region 101, the fine program operation may be performed on the word line WL62 based on the data D185, D186 and D190 stored in the first region 101. Finally, the fine program operation may be performed on the word line WL63 based on the data D188, D189 and D191 stored in the first region 101.

As described above, the method of operating a data storage device according to the third embodiment of the inventive concept can use an N-step program method. Conditions for at least one of N step programs can be changed based on data to be programmed into surrounding memory cells. For example, in a 3-step program method, program operations may be performed in the order of a 1-step program, a coarse program, and a fine program. In this case, the level of the program voltage used in the 1-step program, the time when the program voltage is applied, and/or other factors, can be changed. The level of the program voltage used in the coarse-step program, the time when the program voltage is applied, and/or other factors, can be changed. The level of a program voltage used in the fine-step program, the time when the program voltage is applied, and/or other factors, can be changed.

Figure 11:
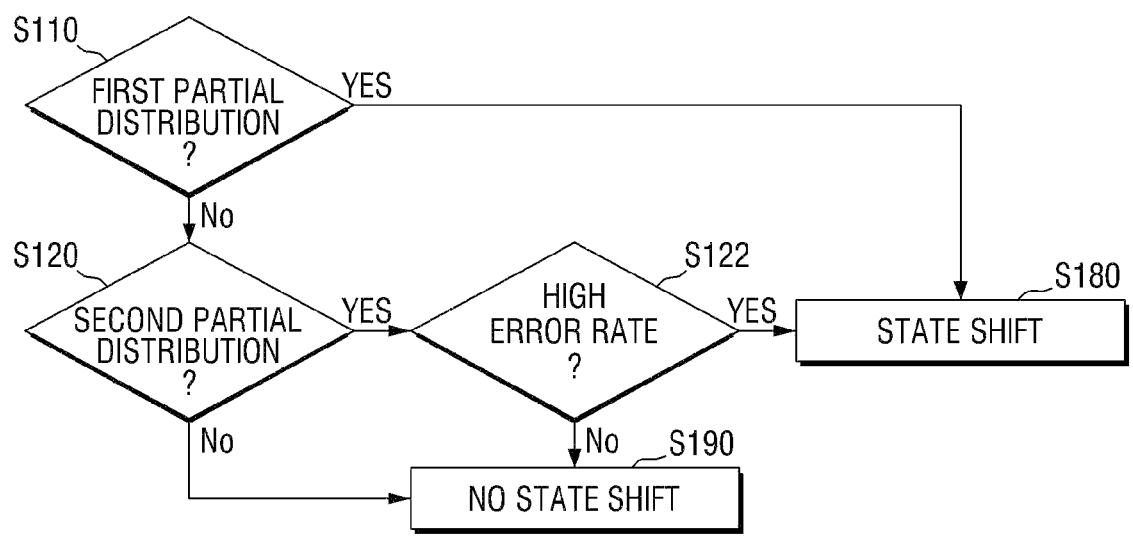
FIG. 11 is a flowchart illustrating a method of operating a data storage device, according to a fourth embodiment of the inventive concept.
Figure 12:
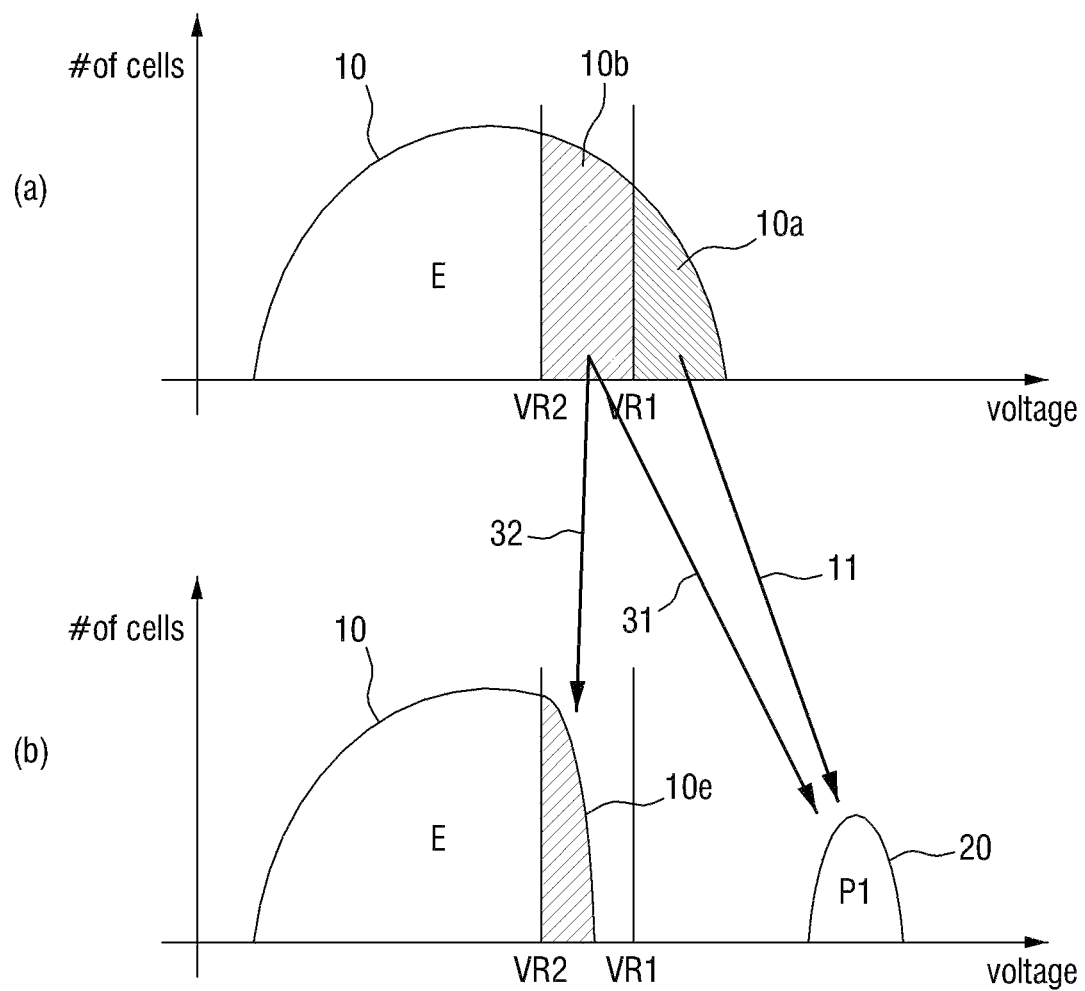
FIG. 12 is a distribution diagram illustrating the data storage device operation method of FIG. 11, according to a fourth embodiment of the inventive concept.

FIG. 11 is a flowchart illustrating a method of operating a data storage device according to a fourth embodiment of the inventive concept. FIG. 12 is a distribution diagram illustrating the data storage device operation method of FIG. 11, according to the fourth embodiment. More particularly, graph (a) shows a first threshold voltage distribution 10 and graph (b) shows first and second threshold voltage distributions 10 and 20 in FIG. 12. The first threshold voltage distribution 10 is shown as an erase state distribution E, for purposes of illustration. However, the inventive concept is not limited thereto. For example, the first threshold voltage distribution 10 may be a program state distribution (e.g., P1, P2, P3 or the like). In FIG. 12, the x axis represents voltage, and the y axis represents the number of cells in each of graphs (a) and (b).

Referring to FIGS. 11 and 12, it is sensed whether a memory cell corresponds to a first partial distribution 10a of the first threshold voltage distribution 10 (operation S110). For example, a threshold voltage of the memory cell may be compared with a first reference voltage VR1. When the threshold voltage of the memory cell is greater than the first reference voltage VR1, it is determined that the memory cell corresponds to the first partial distribution 10a. The first partial distribution 10a may be an uppermost portion of the first threshold voltage distribution 10.

When the memory cell corresponds to the first partial distribution 10a of the first threshold voltage distribution 10 (that is, YES in operation S110), the memory cell is shifted to correspond to a second threshold voltage distribution 20 (operation S180), as indicated by arrow 11 in FIG. 12. This because, when the memory cell corresponds to the first partial distribution 10a, it may have a very high error rate (i.e., a very high probability of having an error) due to coupling with adjacent cells, a program/pass/read disturb, or the like. Therefore, when the memory cell corresponds to the first partial distribution 10a of the first threshold voltage distribution 10, the memory cell is shifted automatically to correspond to the second threshold voltage distribution 20. The second threshold voltage distribution 20 may be a program state distribution (e.g., P1), for example, but the inventive concept is not limited thereto.

In this case, information about the memory cell for which the state has been shifted is stored in a parity region. The stored information can be used in subsequent operations (e.g., program, encoding, verify, and read operations).

Shifting the memory cell, which corresponds to the first partial distribution 10a, to the second threshold voltage distribution 20 as described above may reduce an error rate. For example, the bit error rate (BER) of the memory cell can be reduced.

When it is determined that the memory cell does not correspond to the first partial distribution 10a of the first threshold voltage distribution 10 (that is, NO in operation S110), it is sensed whether the memory cell corresponds to a second partial distribution 10b of the first threshold voltage distribution 10 (operation S120). For example, the threshold voltage of the memory cell may be compared with a second reference voltage VR2. When the threshold voltage of the memory cell is between the first reference voltage VR1 and the second reference voltage VR2, it is determined that the memory cell corresponds to the second partial distribution 10b. The second partial distribution 10b may correspond to a second uppermost portion of the first threshold voltage distribution 10. Here, the first partial distribution 10a and the second partial distribution 10b of the first threshold voltage distribution 10 may not overlap each other.

When the memory cell corresponds to the second partial distribution 10b of the first threshold voltage distribution 10 (that is, YES in operation S120), it is determined whether the memory cell has a high error rate (operation S122). In other words, memory cells with high error rates are selected. Specifically, when the memory cell corresponds to the second partial distribution 10b, it may be determined whether the memory cell has a high error rate based on data that is to be programmed into surrounding (adjacent) cells. A memory cell may have an error due to coupling with the adjacent cells, a program/pass/read disturb, or the like. That is, the memory cell is affected by the surrounding memory cells.

For example, it may be determined whether memory cell MC0 has a high error rate based on data that is to be programmed into surrounding memory cells MC1 through MC8, as discussed above with reference to FIGS. 1 and 2A-2D. It may be assumed that the memory cells MC0 through MC8 are 4-bit MLCs for purposes of illustration. That is, 0000 through 1110 may be programmed into the memory cells MC0 through MC8. In this case, if 1110, 1101 and 1100 are programmed into a preset number of surrounding memory cells MC1 through MC8 from among a total number of surrounding memory cells MC0 through MC8, it can be determined that the memory cell MC0 has a "high error rate."

For example, whether the memory cell MC0 has a high error rate may be determined based on data that is to be programmed into one or more memory cells MC4, MC3 and MC5 connected to an upper word line WL2 (see FIG. 2B). Alternatively, whether the memory cell MC0 has a high error rate may be determined based on data that is to be programmed into memory cells MC1 and MC2 connected to the same word line WL1 as the word line MC0 (see FIG. 2C). Alternatively, whether the memory cell MC0 has a high error rate may be determined based on data that is to be programmed into memory cells MC3 and MC6 connected to the same bit line BL1 as the memory cell MC0 (see FIG. 2D).

Referring again to FIGS. 11 and 12, when the memory cell is determined to have a high error rate (that is, YES in operation S122), the memory cell is shifted to correspond to the second threshold voltage distribution 20 (operation S180) as indicated by arrow 31 in FIG. 12. This is because, although the memory cell belongs to the second partial distribution 10b and does not belong to the first partial distribution 10a, it can still be determined, e.g., based on data to be programmed into the surrounding memory cells, that the memory cell has a high error rate. Therefore, the state of the memory cell is shifted to the second threshold voltage distribution 20. In this case, information about the memory cell for which the state has been shifted is stored in the parity region.

When the memory cell is determined to have a low error rate (that is, NO in operation S122), the state of the memory cell is not shifted (operation S190) as indicated by an arrow 32 in FIG. 12. When the memory cell does not correspond to the second partial distribution 10b of the first threshold voltage distribution 10 (that is, NO in operation S120), the state of the memory cell is not shifted (operation S190).

Consequently, referring to graph (b) in FIG. 12, there is no memory cell having a threshold voltage higher than the first reference voltage VR1 in the first threshold voltage distribution 10. In addition, the number of memory cells having threshold voltages between the first reference voltage VR1 and the second reference voltage VR2 is significantly reduced. That is, the second partial distribution 10e shown in graph (b) of FIG. 12 is smaller than the second partial distribution 10b shown in graph (a) of FIG. 12.

In the method of operating a data storage device according to the fourth embodiment of the inventive concept, when a memory cell corresponds to the first partial distribution 10a (i.e., the uppermost portion) of the first threshold voltage distribution 10, it is shifted to correspond to the second threshold voltage distribution 20. On the other hand, when the memory cell corresponds to the second partial distribution 10b (i.e., the second uppermost portion), an error rate of the memory cell is identified, and the memory cell is shifted to correspond to the second threshold voltage distribution 20 only when it is determined that the memory cell has a high error rate. When the state of the memory cell is shifted, information about the shift may be stored in the parity region. Since the memory cell corresponding to the second partial distribution 10b is not automatically shifted to the second threshold voltage distribution 20, but is shifted only when the memory cell has a high error rate, the parity region used may be small.

Stated generally, A % ($0<A\leq100$) of a plurality of memory cells corresponding to the first partial distribution 10a are shifted to correspond to the second threshold voltage distribution 20, and B % ($0<B\leq100$, $B<A$) of a plurality of memory cells corresponding to the second partial distribution 10b are shifted to correspond to the second threshold voltage distribution 20. In the method of operating a data storage device according to the fourth embodiment of the inventive concept discussed above, A is 100. That is, all memory cells corresponding to the first partial distribution 10a are shifted to the second threshold voltage distribution 20. B may be less than 100 and less than A.

The method of operating a data storage device according to the fourth embodiment of the inventive concept may be applied to a data storage system that employs an on-chip buffered program. In the on-chip buffered program, data to be programmed is stored in a buffer of a nonvolatile memory device and then programmed into a memory cell array. Therefore, it is easy to know what data is to be programmed into memory cells connected to an upper word line. The method of operating a data storage device according to the fourth embodiment of the inventive concept may also be applied to a data storage system in which a buffer is installed in a controller.

Figure 13:
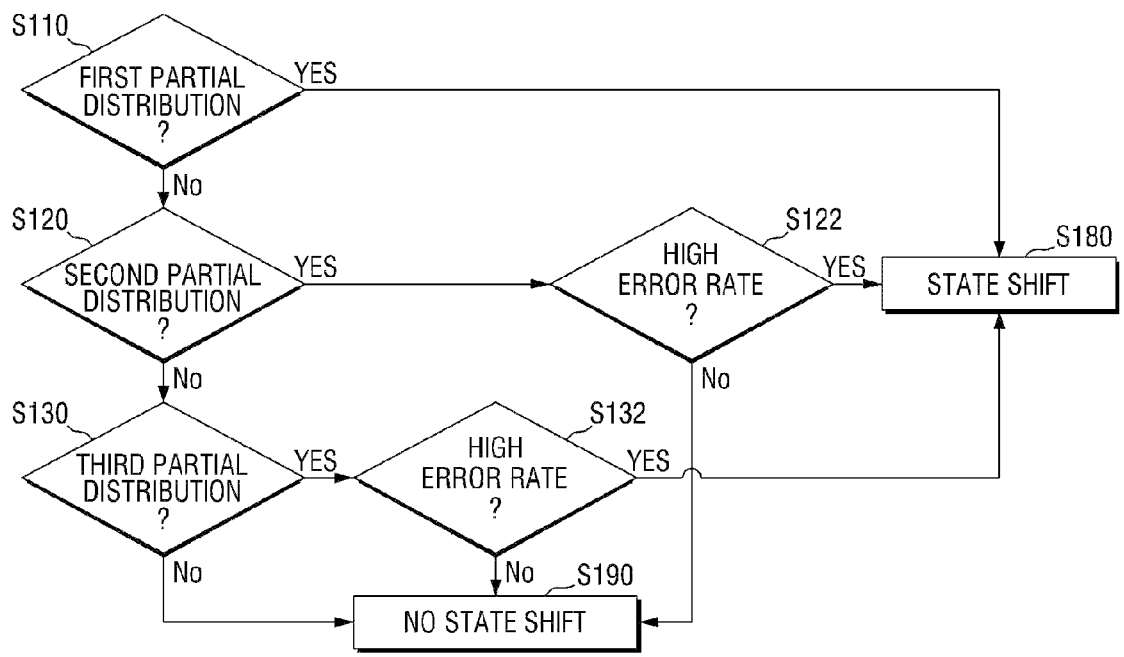
FIG. 13 is a flowchart illustrating a method of operating a data storage device, according to a fifth embodiment of the inventive concept.
Figure 14:
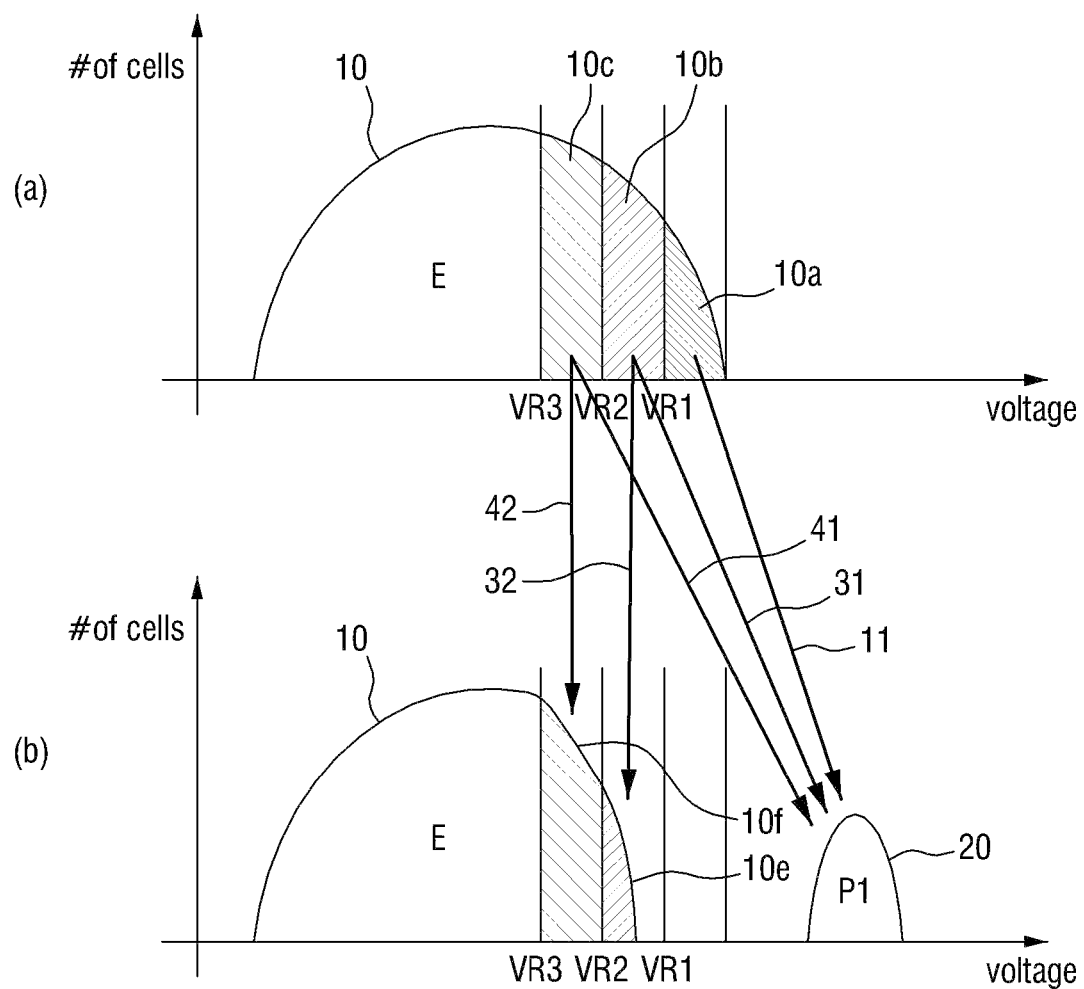
FIG. 14 is a distribution diagram illustrating the data storage device operation method of FIG. 13, according to a fifth embodiment of the inventive concept.

FIG. 13 is a flowchart illustrating a method of operating a data storage device, according to a fifth embodiment of the inventive concept. FIG. 14 is a distribution diagram illustrating the data storage device operation method of FIG. 13, according to the fifth embodiment. For simplicity, descriptions of features described above with reference to FIGS. 11 and 12 will be omitted.

Referring to FIGS. 13 and 14, a memory cell is processed differently according to which of three threshold voltage distributions 10a, 10b and 10c the memory cell corresponds to. That is, it is determined whether the memory cell corresponds to a first partial distribution 10a, a second partial distribution 10b, or a third partial distribution 10c of a first threshold voltage distribution 10. The first partial distribution 10a, the second partial distribution 10b, and the third partial distribution 10c may not overlap each other.

It is sensed whether a memory cell corresponds to the first partial distribution 10a of the first threshold voltage distribution 10 (operation S110). For example, a threshold voltage of the memory cell is compared with a first reference voltage VR1. When the threshold voltage of the memory cell is greater than the first reference voltage VR1, it is determined that the memory cell corresponds to the first partial distribution 10a.

When the memory cell corresponds to the first partial distribution 10a of the first threshold voltage distribution 10 (that is, YES in operation S110), the memory cell is shifted to correspond to a second threshold voltage distribution 20 (operation S180), as indicated by arrow 11 in FIG. 14.

When the memory cell does not correspond to the first partial distribution 10a of the first threshold voltage distribution 10 (that is, NO in operation S110), it is sensed whether the memory cell corresponds to the second partial distribution 10b of the first threshold voltage distribution 10 (operation S120). Specifically, when the threshold voltage of the memory cell is between a second reference voltage VR2 and the first reference voltage VR1, the memory cell is determined to correspond to the second partial distribution 10b.

When the memory cell corresponds to the second partial distribution 10b of the first threshold voltage distribution 10 (that is, YES in operation S120), it is determined whether the memory cell has a high error rate (operation S122). When the memory cell has a high error rate (that is, YES in operation S122), the memory cell is shifted to correspond to the second threshold voltage distribution 20 (operation S180), as indicated by arrow 31 in FIG. 14. When the memory cell does not have a high error rate (or has a low error rate) (that is, NO in operation S122), the state of the memory cell is not shifted (operation S190), as indicated by an arrow 32 in FIG. 14.

When the memory cell does not correspond to the second partial distribution 10b of the first threshold voltage distribution 10 (that is, NO in operation S120), it is sensed whether the memory cell corresponds to the third partial distribution 10c of the first threshold voltage distribution 10 (operation S130). Specifically, when the threshold voltage of the memory cell is between a third reference voltage VR3 and the second reference voltage VR2, the memory cell is determined to correspond to the third partial distribution 10c.

When the memory cell corresponds to the third partial distribution 10c of the first threshold voltage distribution 10 (that is, YES in operation S130), it is determined whether the memory cell has a high error rate (operation S132). When the memory cell has a high error rate (that is, YES in operation S132), the memory cell is shifted to correspond to the second threshold voltage distribution 20 (operation S180), as indicated by an arrow 41 in FIG. 14. When the memory cell does not have a high error rate (or has a low error rate) (that is, NO in operation S132), it is not shifted (operation S190), as indicated by an arrow 42 in FIG. 14.

In operation S122, the memory cell is shifted to correspond to the second threshold voltage distribution 20 when the error rate of the memory cell is equal to or greater than a first level. In comparison, in operation S132, the memory cell is shifted to correspond to the second threshold voltage distribution 20 when the error rate of the memory cell is equal to or greater than a second level. The first level used in operation S122 may be different from the second level used in operation S132. Specifically, the second level may be higher than the first level. For example, it may be assumed that the memory cell is a 4-bit MLC. That is, 0000 through 1110 may be programmed into the memory cell. In this case, in operation S122, when 1110, 1101 and 1100 are programmed into a preset number of surrounding memory cells from among a total number of surrounding memory cells, it may be determined that the memory cell has a high error rate. In comparison, in operation S132, when 1110 is programmed into a preset number of surrounding memory cells from among the total number of surrounding memory cells, it may be determined that the memory cell has a high error rate.

The reason for the above process is as follows. Basically, a memory cell corresponding to the third partial distribution 10c is less likely to have an error than a memory cell corresponding to the second partial distribution 10b. Therefore, the memory cell corresponding to the third partial distribution 10c is shifted to correspond to the second threshold voltage distribution 20 only when data to be programmed into surrounding memory cells is likely to have great influence.

Consequently, referring to graph (b) of FIG. 14, there is no memory cell having a threshold voltage higher than the first reference voltage VR1 in the first threshold voltage distribution 10. In addition, the number of memory cells having threshold voltages between the first reference voltage VR1 and the second reference voltage VR2 is significantly reduced. That is, a second partial distribution 10e shown in graph (b) of FIG. 14 is smaller than the second partial distribution 10b shown in graph (a) of FIG. 14. Further, the number of memory cells having threshold voltages between the second reference voltage VR2 and the third reference voltage VR3 is reduced. That is, a third partial distribution 10f shown in graph (b) of FIG. 14 is smaller than the third partial distribution 10c shown in graph (a) of FIG. 14.

Figure 15:
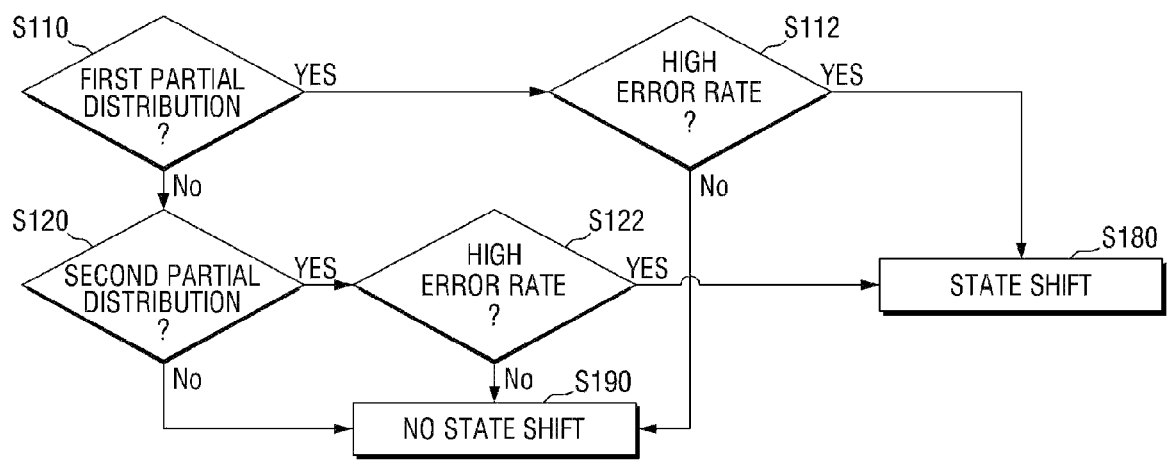
FIG. 15 is a flowchart illustrating a method of operating a data storage device, according to a sixth embodiment of the inventive concept.
Figure 16:
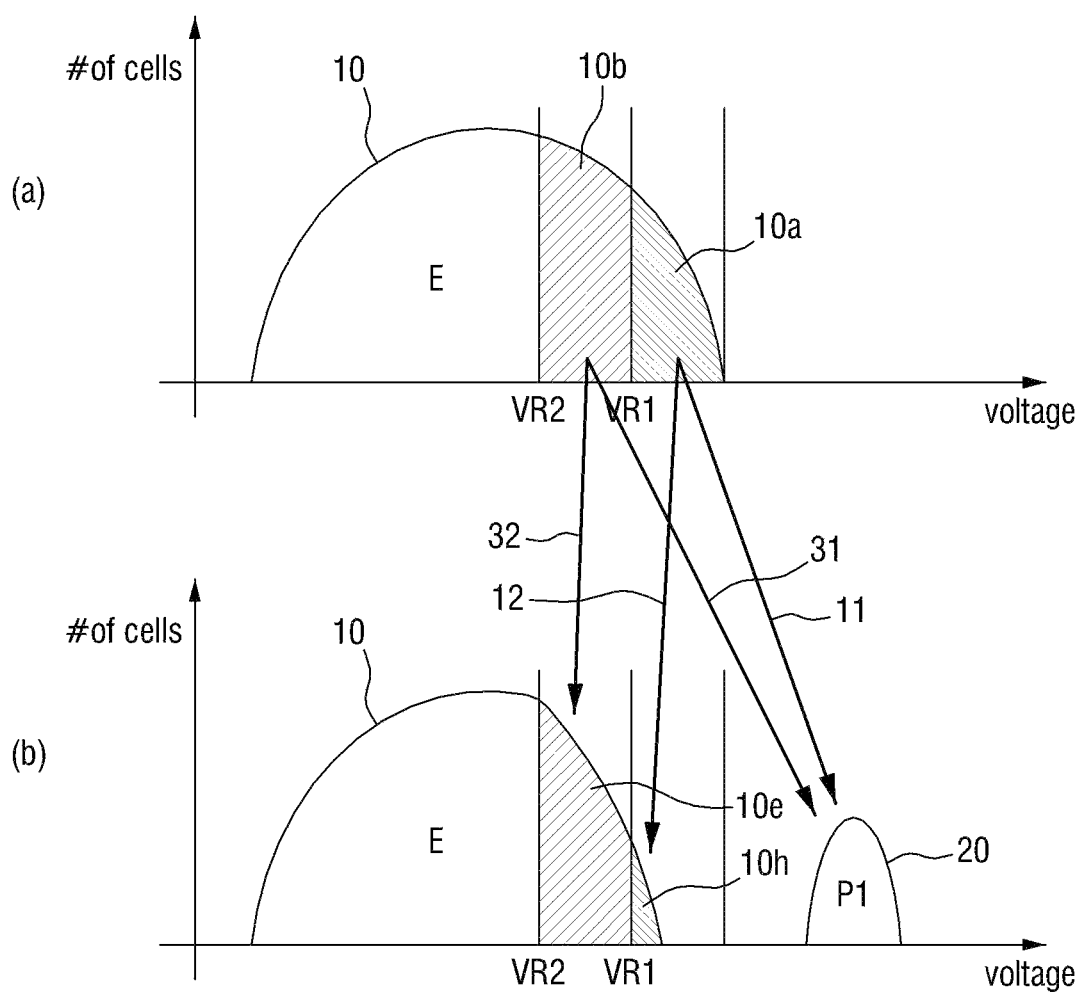
FIG. 16 is a distribution diagram illustrating the data storage device operation method of FIG. 15, according to a sixth embodiment of the inventive concept.

FIG. 15 is a flowchart illustrating a method of operating a data storage device, according to a sixth embodiment of the inventive concept. FIG. 16 is a distribution diagram illustrating the data storage device operation method of FIG. 15, according to the fifth embodiment. For simplicity, descriptions of features described above with reference to FIGS. 11 and 12 will be omitted.

Referring to FIGS. 15 and 16, in the method of operating a data storage device according to the sixth embodiment, a memory cell is processed differently according to which of two threshold voltage distributions 10a and 10b the memory cell corresponds to. In particular, even when the memory cell corresponds to a first partial distribution 10a, it can be determined whether the memory cell has a "high error rate." That is, even when the memory cell corresponds to the first partial distribution 10a, it is not automatically shifted to a second threshold voltage distribution 20.

It is sensed whether a memory cell corresponds to the first partial distribution 10a of a first threshold voltage distribution 10 (operation S110). Specifically, a threshold voltage of the memory cell is compared with a first reference voltage VR1. When the threshold voltage of the memory cell is greater than the first reference voltage VR1, it is determined that the memory cell corresponds to the first partial distribution 10a.

When the memory cell corresponds to the first partial distribution 10*a* of the first threshold voltage distribution 10 (that is, YES in operation S110), it is determined whether the memory cell has a high error rate (operation S112). When the memory cell has a high error rate (that is, YES in operation S112), the memory cell is shifted to correspond to the second threshold voltage distribution 20 (operation S180), as indicated by arrow 11 in FIG. 16. Specifically, when the error rate of the memory cell is equal to or higher than a fourth level, the memory cell is shifted to correspond to the second threshold voltage distribution 20. When the memory cell does not have a high error rate (or has a low error rate) (that is, NO in operation S112), the state of the memory cell is not shifted (operation S190), as indicated by an arrow 12 in FIG. 16.

When the memory cell does not correspond to the first partial distribution 10*a* of the first threshold voltage distribution 10 (that is, NO in operation S110), it is sensed whether the memory cell corresponds to a second partial distribution 10*b* of the first threshold voltage distribution 10 (operation S120). Specifically, when the threshold voltage of the memory cell is between a second reference voltage VR2 and the first reference voltage VR1, the memory cell is determined to correspond to the second partial distribution 10*b*.

When the memory cell corresponds to the second partial distribution 10*b* of the first threshold voltage distribution 10 (that is, YES in operation S120), it is determined whether the memory cell has a high error rate (operation S122). When the memory cell has a high error rate (that is, YES in operation S122), the memory cell is shifted to correspond to the second threshold voltage distribution 20 (operation S180), as indicated by arrow 31 in FIG. 16. Specifically, when the error rate of the memory cell is equal to or greater than a first level, the memory cell is shifted to correspond to the second threshold voltage distribution 20. The fourth level used in operation S112 may be different from the first level used in operation S122. For example, the fourth level may be higher than the first level. When the memory cell does not have a high error rate (or has a low error rate) (that is, NO in operation S122), the state of the memory cell is not shifted (operation S190), as indicated by an arrow 32 in FIG. 16.

Consequently, referring to FIG. 16, a first partial distribution 10*h* shown in graph (b) of FIG. 16 is smaller than the first partial distribution 10*a* shown in graph (a) in FIG. 16. In addition, a second partial distribution 10*e* shown in graph (b) of FIG. 16 is smaller than the second partial distribution 10*b* shown in graph (a) of FIG. 16.

Stated generally, A % (0<A≤100) of a plurality of memory cells corresponding to the first partial distribution 10*a* are shifted to correspond to the second threshold voltage distribution 20, and B % (0<B≤100, B<A) of a plurality of memory cells corresponding to the second partial distribution 10*b* are shifted to correspond to the second threshold voltage distribution 20. In the method of operating a data storage device according to the sixth embodiment of the inventive concept, A may not be 100, and B may be smaller than A.

FIGS. 17 through 20 are block diagrams showing application examples of a data storage system, according to embodiments of the inventive concept.

Figure 17:
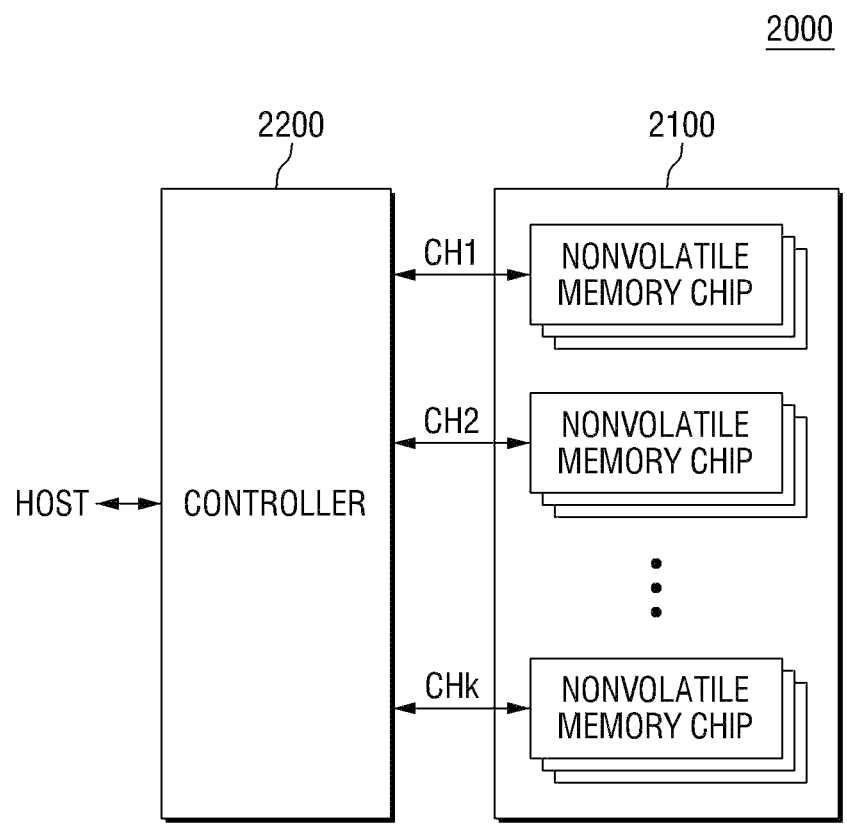
FIGS. 17 through 20 are block diagrams showing application examples of a data storage system, according to embodiments of the inventive concept.

Referring to FIG. 17, a data storage system 2000 includes a nonvolatile memory device 2100 and a controller 2200, implemented according to embodiments of the present inventive concept. The nonvolatile memory device 2100 includes a plurality of nonvolatile memory chips. The nonvolatile memory chips form multiple memory chip groups. Each of the memory chip groups has one common channel for communication with the controller 2200. For example, the nonvolatile memory chip groups may communicate with the controller 2200 through first through $k^{th}$ channels CH1 through CHk, respectively.

In FIG. 17, a plurality of nonvolatile memory chips (in a nonvolatile memory chip group) are connected to one channel. However, the data storage system 2000 may be modified such that one nonvolatile memory chip is connected to one channel.

Figure 18:
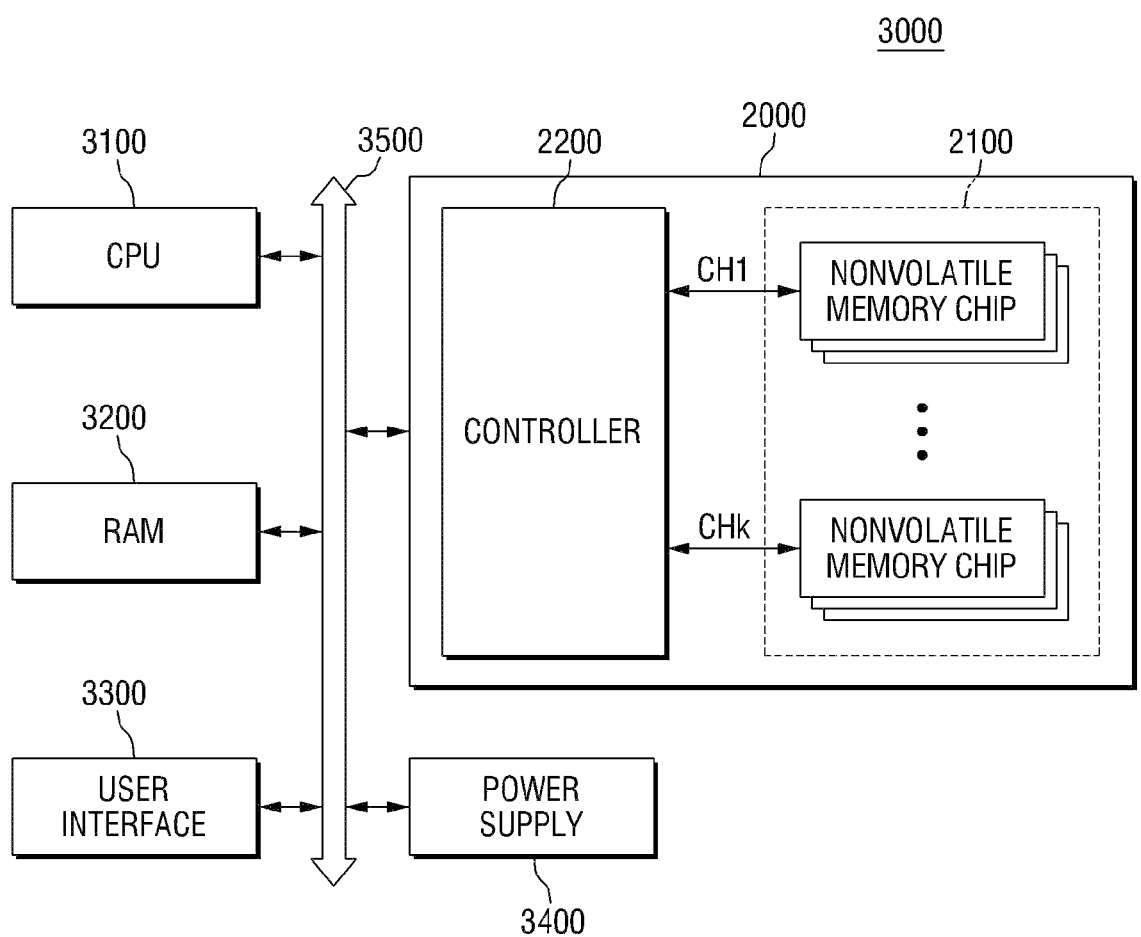

Referring to FIG. 18, a computing system 3000 includes a central processing unit (CPU) 3100, a RAM 3200, a user interface 3300, a power supply 3400, and the data storage system 2000. The data storage system 2000 is electrically connected to the CPU 3100, the RAM 3200, the user interface 3300, and the power supply 3400 through a system bus 3500. Data provided through the user interface 3300 or processed by the CPU 3100 is stored in the data storage system 2000.

In FIG. 18, the nonvolatile memory device 2100 is connected to the system bus 3500 through the controller 2200. However, the nonvolatile memory device 2100 may also be connected directly to the system bus 3500. Further, although the computing system 3000 in FIG. 18 includes the data storage system 2000 of FIG. 17, the inventive concept is not limited thereto.

Figure 19:
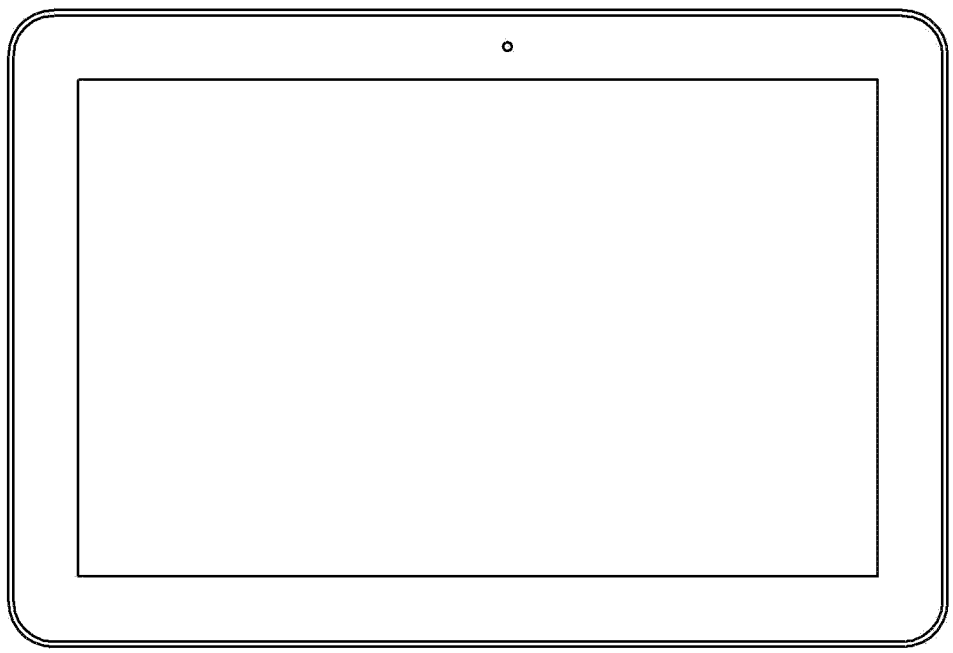
Figure 20:
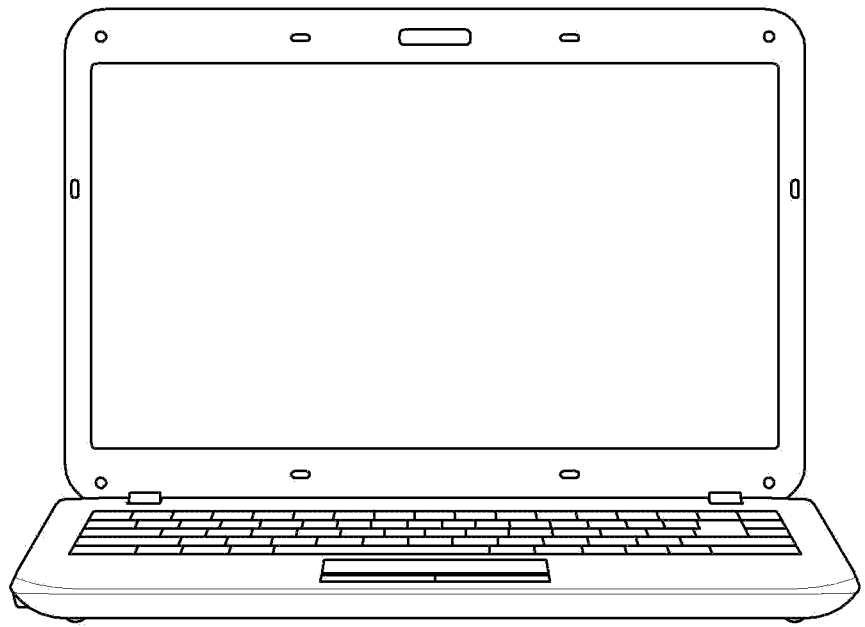

FIG. 19 shows a table PC, and FIG. 20 shows a notebook, each of which may include the computing system 3000 and/or the data storage system 2000. The data storage system according to embodiments of the inventive concept may be used in electrical products other than the tablet PC and the notebook, as would be apparent to one of ordinary skill in the art.

While the inventive concept has been described with reference to illustrative embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A method of operating a data storage device, the method comprising:
    providing a memory cell array, comprising a first word line and a second word line, and a buffer configured to store second data to be programmed into the second word line;
    reading the second data from the buffer; and
    programming first data into memory cells connected to the first word line, a programming condition of the first data being changed based on the second data read from the buffer, wherein programming the first data into the first word line comprises:
        sensing first memory cells connected to the first word line that belong to a first partial distribution included in a first threshold voltage distribution, and sensing second memory cells connected to the first word line that belong to a second partial distribution included in the first threshold voltage distribution;
        selecting at least one second memory cell having a high error rate from the sensed second memory cells based on the second data read from the buffer; and
        shifting the selected at least one second memory cell having the high error rate to a second threshold voltage distribution which is different from the first threshold voltage distribution.

2. The method of claim 1, further comprising:
    programming the second data into the second word line after the programming of the first data into the first word line.

3. The method of claim 1, wherein the programming condition of the first data is changed by changing a program voltage for programming the first data.

4. The method of claim 3, wherein the program voltage is an incremental step pulse programming (ISPP) voltage which is increased step by step from a start voltage by a delta voltage in each program loop.

5. The method of claim 4, wherein the programming condition of the first data is changed by changing the delta voltage or the start voltage based on the second data.

6. The method of claim 1, wherein the programming condition is changed by changing a verify voltage.

7. The method of claim 1,
wherein the first partial distribution and the second partial distribution included in the first threshold voltage distribution do not overlap each other.

8. The method of claim 7, wherein programming of the first data into the first word line further comprises:
shifting the first memory cells belonging to the first partial distribution to the second threshold voltage distribution, regardless of the second data.

9. The method of claim 7, wherein in sensing whether the memory cells connected to the first word line belong to the first partial distribution or the second partial distribution comprises comparing threshold voltages of the memory cells with a first reference voltage and a second reference voltage which are different from each other, wherein memory cells having threshold voltages greater than the first reference voltage correspond to the first partial distribution, and memory cells having threshold voltages between the first reference voltage and the second reference voltage correspond to the second partial distribution.

10. The method of claim 7, wherein A % of the memory cells corresponding to the first partial distribution are shifted to correspond to the second threshold voltage distribution, and B % of the memory cells corresponding to the second partial distribution are shifted to correspond to the second threshold voltage distribution, where $0 < A \leq 100$, $0 < B \leq 100$, and $B < A$.

11. A method of operating a data storage device, the method comprising:
sensing whether a plurality of memory cells belong to a first partial distribution or a second partial distribution included in a first threshold voltage distribution, wherein the first partial distribution and the second partial distribution do not overlap each other; and
shifting A % of a plurality of memory cells, included in the first partial distribution, to correspond to a second threshold voltage distribution which is different from the first threshold voltage distribution, and shifting B % of a plurality of memory cells included in the second partial distribution, to correspond to the second threshold voltage distribution, where $0 < A \leq 100$, $0 < B \leq 100$, and $B < A$.

12. The method of claim 11, wherein the first threshold voltage distribution is an erase state distribution, and the second threshold voltage distribution is a program state distribution.

13. The method of claim 11, wherein the sensing of whether the memory cells belong to the first partial distribution or the second partial distribution comprises comparing threshold voltages of the memory cells with a first reference voltage and a second reference voltage which are different from each other.

14. The method of claim 13, wherein memory cells having threshold voltages greater than the first reference voltage correspond to the first partial distribution.

15. The method of claim 13, wherein memory cells having threshold voltages between the first reference voltage and the second reference voltage correspond to the second partial distribution.

16. The method of claim 11, wherein all of the memory cells corresponding to the first partial distribution are shifted to correspond to the second threshold voltage distribution, and some of the memory cells corresponding to the second partial distribution are shifted to correspond to the second threshold voltage distribution.

17. The method of claim 11, further comprising:
selecting memory cells having high error rates from the memory cells corresponding to the second partial distribution after the sensing of whether the memory cells belong to the first partial distribution or the second partial distribution.

18. The method of claim 17, wherein the memory cells having the high error rates are selected based on data which is to be programmed into memory cells surrounding each of the memory cells corresponding to the second partial distribution.

19. The method of claim 18, wherein the surrounding memory cells are memory cells connected to a word line above each of the memory cells corresponding to the second partial distribution.

20. The method of claim 18, wherein the surrounding memory cells are memory cells connected to a same word line as each of the memory cells corresponding to the second partial distribution.

21. The method of claim 18, wherein the surrounding memory cells are memory cells connected to a same bit line as each of the memory cells corresponding to the second partial distribution.

22. The method of claim 17, further comprising:
selecting memory cells having high error rates from the memory cells corresponding to the first partial distribution.

23. A method of operating a data storage device, the method comprising:
sensing whether a plurality of memory cells belong to a first partial distribution or a second partial distribution, wherein the first partial distribution and the second partial distribution are included in a first threshold voltage distribution and do not overlap each other;
selecting memory cells having high error rates from a plurality of memory cells corresponding to the second partial distribution; and
shifting the selected memory cells having the high error rates to correspond to a second threshold voltage distribution which is different from the first threshold voltage distribution.

24. The method of claim 23, wherein the memory cells having the high error rates are selected based on data which is to be programmed into memory cells surrounding each of the memory cells corresponding to the second partial distribution.

25. The method of claim 24, wherein the surrounding memory cells are memory cells connected to a word line above each of the memory cells corresponding to the second partial distribution.

26. A data storage system comprising:
a nonvolatile memory device comprising a memory cell array comprising a plurality of memory cells connected to a plurality of word lines and a plurality of bit lines;
a buffer configured to store temporarily data sent from a host, including at least first data and second data, and data read out from the nonvolatile memory device; and a controller configured to interface with the host and the nonvolatile memory device, and to control storing the data sent from the host into the nonvolatile memory device, including programming the first data into a first word line of the plurality of word lines and programming the second data into a second word line of the plurality of word lines, wherein before programming the first data into the first word line of the plurality of word lines, the second data to be programmed into the second word line of the plurality of word lines is read from the buffer and a programming condition of the first data is changed based on the second data, and wherein controlling programming the first data into the first word line comprises:

sensing first memory cells connected to the first word line that belong to a first partial distribution included in a first threshold voltage distribution, and sensing second memory cells connected to the first word line that belong to a second partial distribution included in the first threshold voltage distribution;

selecting at least one second memory cell having a high error rate from the sensed second memory cells based on the second data read from the buffer; and shifting the selected at least one second memory cell having the high error rate to a second threshold voltage distribution which is different from the first threshold voltage distribution.

27. The data storage system of claim 26 wherein the buffer is located in the controller.

28. The data storage system of claim 26 wherein the buffer is located in the nonvolatile memory device, and comprising a plurality of flash memory cells.

* * * * *